(12) United States Patent
Kawagoe et al.

(10) Patent No.: US 8,955,432 B2
(45) Date of Patent: Feb. 17, 2015

(54) PATTERN FORMING APPARATUS AND PATTERN FORMING METHOD

(75) Inventors: Masafumi Kawagoe, Kyoto (JP); Mikio Masuichi, Kyoto (JP); Tomoyuki Komura, Kyoto (JP); Hiroyuki Ueno, Kyoto (JP); Miyoshi Nakajima, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 364 days.

(21) Appl. No.: 13/568,329

(22) Filed: Aug. 7, 2012

(65) Prior Publication Data

US 2013/0133535 A1    May 30, 2013

(30) Foreign Application Priority Data

Nov. 30, 2011    (JP) .................................. 2011-261823

(51) Int. Cl.
  *B41F 17/14*  (2006.01)
  *B41F 1/54*  (2006.01)

(52) U.S. Cl.
  USPC .............................. 101/41; 101/287; 101/492

(58) Field of Classification Search
  CPC ............... B41F 1/54; B41F 17/14; G03F 7/00
  USPC .............. 101/327, 287, 41, 492, 493; 29/559, 29/407.1
  See application file for complete search history.

(56) References Cited

U.S. PATENT DOCUMENTS

| | | | |
|---|---|---|---|
| 5,669,303 A | 9/1997 | Maracas et al. | 101/327 |
| 7,296,519 B2 | 11/2007 | Dona et al. | 101/486 |
| 7,636,999 B2 | 12/2009 | Choi et al. | 29/559 |
| 7,641,468 B2 | 1/2010 | Wu et al. | 425/405.1 |
| 8,109,751 B2 | 2/2012 | Ando et al. | 425/385 |
| 8,166,876 B2 * | 5/2012 | Schneider et al. | 101/287 |
| 2007/0262049 A1 | 11/2007 | Miyajima et al. | 216/11 |
| 2010/0173553 A1 | 7/2010 | Tanaka et al. | 445/24 |

FOREIGN PATENT DOCUMENTS

| | | |
|---|---|---|
| JP | 3059473 | 5/1992 |
| JP | 9-240125 | 9/1997 |
| JP | 2007-134368 | 5/2007 |
| JP | 2007-305895 | 11/2007 |
| JP | 2008-012844 | 1/2008 |
| JP | 2010-023249 | 2/2010 |
| JP | 2010-517300 | 5/2010 |
| JP | 2010-158799 | 7/2010 |
| JP | 4639081 | 2/2011 |
| JP | 4648408 | 3/2011 |
| JP | 4690572 | 6/2011 |
| KR | 10-2005-0016441 | 2/2005 |
| WO | WO 03/099463 A2 | 12/2003 |
| WO | WO 03/099463 A3 | 12/2003 |

* cited by examiner

*Primary Examiner* — Leslie J Evanisko
(74) *Attorney, Agent, or Firm* — Ostrolenk Faber LLP

(57) ABSTRACT

The supply of a negative pressure to an opening P(+1) adjacent to an opening P(0) is stopped by switching a suction valve connected to the opening P(+1) from an open state to a closed state while keeping a positive pressure valve connected thereto closed. Then, near the opening P(+1), a force for holding a blanket becomes gradually weaker against a pressure force in a pressurized space. Associated with that, an air component in the pressurized space flows into a space between a portion of the blanket vertically above the opening P(+1) and an upper surface, whereby the blanket portion is lifted from the upper surface and brought into contact with the lower surface of a printing plate. In this way, a contact area is slowly and stably widened while a sudden change of a pressure in the pressurized space SP5 is suppressed.

9 Claims, 22 Drawing Sheets

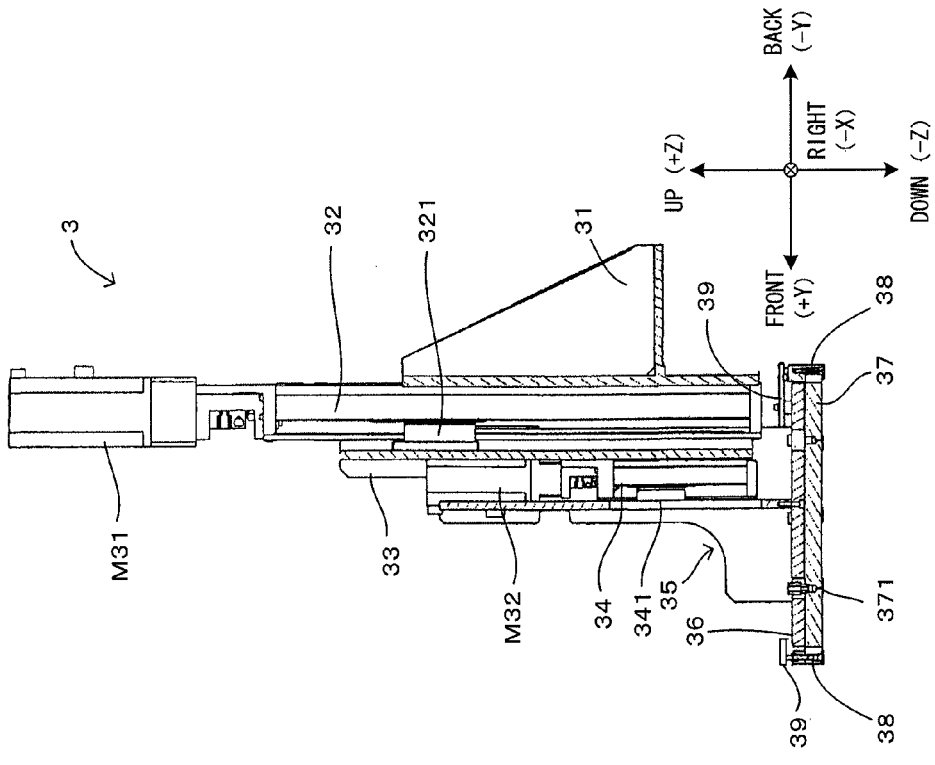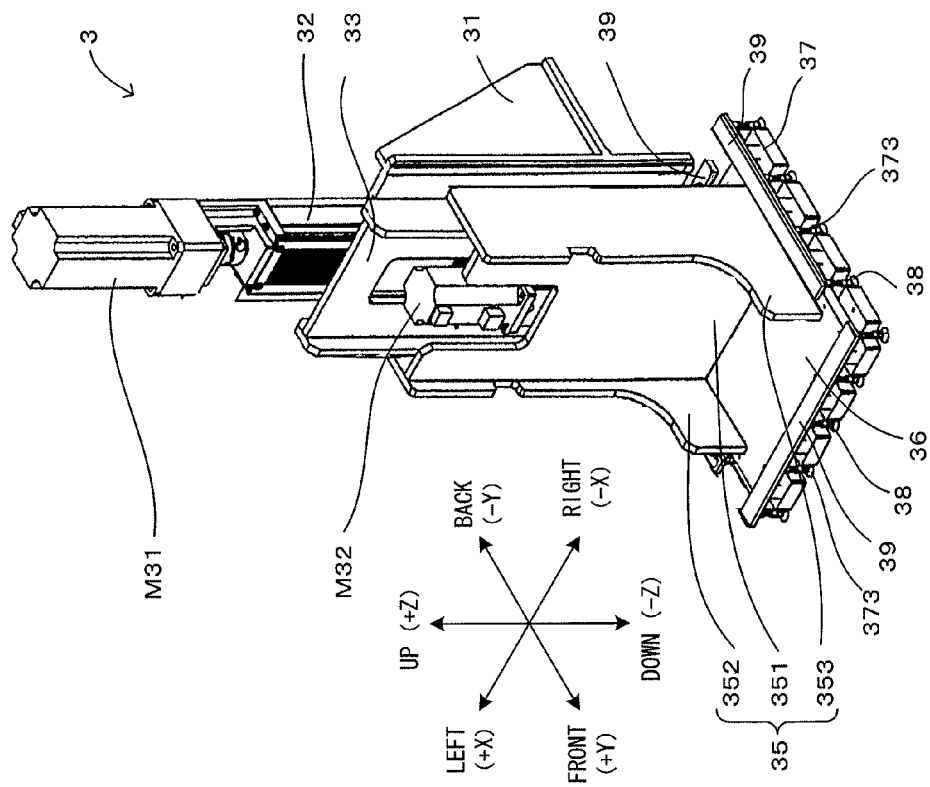

F I G. 1 4

(a)

| STEP | SUB STEP | CONTROL TARGET | OPERATION CONTENTS |
|---|---|---|---|
| S3 | 3-1 | PRINTING PLATE SHUTTLE 25L | MOVE TO PRINTING PLATE SUCTION POSITION XP23 |
| | 3-2 | PRINTING PLATE SHUTTLE 25L | MOVE DOWNWARD TO PRE-ALIGNMENT POSITION |
| | 3-3 | PRE-ALIGNMENT UPPER PART 81 | PRE-ALIGNMENT OF PRINTING PLATE PP |
| | 3-4 | UPPER STAGE UNIT 3 | MOVING DOWNWARD OF SUCTION PLATE 37 → SUCTION OF PRINTING PLATE PP |
| | 3-5 | UPPER STAGE UNIT 3 | ELEVATION OF SUCTION PLATE 37 |
| | 3-6 | PRINTING PLATE SHUTTLE 25L | MOVE UPWARD TO TRANSFER POSITION |
| | 3-7 | PRINTING PLATE SHUTTLE 25L | MOVE TO MIDDLE POSITION XP22 |
| S4 | 4-1 | ALIGNMENT STAGE 44 | MOVE TO INITIAL POSITION |
| | 4-2 | LIFT PIN UNIT 55 | ELEVATION OF LIFT PIN |
| | 4-3 | BLANKET SHUTTER | OPEN |
| | 4-4 | (CONVEYANCE ROBOT) | LOAD BLANKET BL |
| | 4-5 | BLANKET SHUTTER | CLOSE |
| | 4-6 | LIFT PIN UNIT 55 | MOVING DOWNWARD OF LIFT PIN |
| | 4-7 | PRE-ALIGNMENT LOWER PART 82 | PRE-ALIGNMENT OF BLANKET BL |
| | 4-8 | LOWER STAGE UNIT 5 | SUCTION OF BLANKET BL |
| | 4-9 | PRE-ALIGNMENT LOWER PART 82 | RETRACTION OF LOWER GUIDE |

| STEP | SUB STEP | CONTROL TARGET | OPERATION CONTENTS |
|------|----------|----------------|--------------------|
| S7 | 7-1 | PRINTING PLATE SHUTTLE 25L | ROTATION OF HAND (OPPOSITE POSITION) |
| | 7-2 | PRINTING PLATE SHUTTLE 25L | MOVE TO PRINTING PLATE SUCTION POSITION XP23 |
| | 7-3 | UPPER STAGE UNIT 3 | MOVING DOWNWARD OF SUCTION PLATE 37 → RELEASE SUCTION OF PRINTING PLATE PP |
| | 7-4 | UPPER STAGE UNIT 3 | ELEVATION OF SUCTION PLATE 37 |
| | 7-5 | PRINTING PLATE SHUTTLE 25L | MOVE TO MIDDLE POSITION XP22 |
| S8 | 8-1 | SUBSTRATE SHUTTLE 25R | MOVE TO SUBSTRATE SUCTION POSITION XP23 |
| | 8-2 | SUBSTRATE SHUTTLE 25R | MOVE DOWNWARD TO PRE-ALIGNMENT POSITION |
| | 8-3 | PRE-ALIGNMENT UPPER PART 81 | PRE-ALIGNMENT OF SUBSTRATE SB |
| | 8-4 | UPPER STAGE UNIT 3 | MOVING DOWNWARD OF SUCTION PLATE 37 → SUCTION OF SUBSTRATE SB |
| | 8-5 | UPPER STAGE UNIT 3 | ELEVATION OF SUCTION PLATE 37 |
| | 8-6 | SUBSTRATE SHUTTLE 25R | MOVE UPWARD TO TRANSFER POSITION |
| | 8-7 | SUBSTRATE SHUTTLE 25R | MOVE TO MIDDLE POSITION XP24 |

| STEP | SUB STEP | CONTROL TARGET | OPERATION CONTENTS |
|---|---|---|---|
| S9 | 9-1 | BLANKET THICKNESS MEASUREMENT UNIT 56 | MOVE OF SENSOR SN51 TOWARD BLANKET BL SIDE |
| | 9-2 | BLANKET THICKNESS MEASUREMENT UNIT 56 | MEASURE THICKNESS OF BLANKET BL |
| | 9-3 | BLANKET THICKNESS MEASUREMENT UNIT 56 | MOVE OF SENSOR SN51 TO RETRACT POSITION |
| | 9-4 | UPPER STAGE UNIT 3 | MOVING DOWN/POSITIONING OF SUCTION PLATE 37 |
| | 9-5 | PRESSING UNIT 7 | MOVING DOWNWARD OF PRESSING MEMBER 71 |
| | 9-6 | ALIGNMENT PART 4 | FOCUS ADJUSTMENT TO BLANKET BL |
| | 9-7 | ALIGNMENT PART 4 | OBTAIN IMAGE |
| | 9-8 | ALIGNMENT PART 4 | PRECISE ALIGNMENT |
| | 9-9 | LOWER STAGE UNIT 5 | RISING OF BLANKET BL |

| STEP | SUB STEP | CONTROL TARGET | OPERATION CONTENTS |
|---|---|---|---|
| S10 | 10-1 | UPPER STAGE UNIT 3 | SEPARATION PROCESS BY ELEVATION OF SUCTION PLATE 37 |
| | 10-2 | UPPER STAGE UNIT 3 | POSITIONING OF SUCTION PLATE 37 TO STATIC ELIMINATION POSITION |
| | 10-3 | PRESSING UNIT 7 | ELEVATION OF PRESSING MEMBER 71 |
| | 10-4 | IONIZER 91 | ELIMINATION OF ELECTRICITY |
| | 10-5 | UPPER STAGE UNIT 3 | ELEVATION OF SUCTION PLATE 37 |

F I G. 1 9

(a)

| STEP | SUB STEP | CONTROL TARGET | OPERATION CONTENTS |
|---|---|---|---|
| S11 | 11-1 | SUBSTRATE SHUTTLE 25R | MOVE TO SUBSTRATE SUCTION POSITION XP23 |
| | 11-2 | UPPER STAGE UNIT 3 | MOVING DOWN OF SUCTION PLATE 37 → RELEASE SUCTION OF SUBSTRATE SB |
| | 11-3 | UPPER STAGE UNIT 3 | ELEVATION OF SUCTION PLATE 37 |
| | 11-4 | SUBSTRATE SHUTTLE 25R | MOVE TO MIDDLE POSITION XP24 |
| S12 | 12-1 | LOWER STAGE UNIT 5 | RELEASE SUCTION OF BLANKET BL |
| | 12-2 | LIFT PIN UNIT 55 | ELEVATION OF LIFT PIN |
| | 12-3 | BLANKET SHUTTER | OPEN |
| | 12-4 | (CONVEYANCE ROBOT) | RETRACT BLANKET BL |
| | 12-5 | BLANKET SHUTTER | CLOSE |
| | 12-6 | LIFT PIN UNIT 55 | MOVING DOWN OF LIFT PIN |
| S13 | 13-1 | PRINTING PLATE SHUTTLE 25L | MOVE TO PRINTING PLATE TRANSFER POSITION XP21 |
| | 13-2 | PRINTING PLATE SHUTTER 18 | OPEN |
| | 13-3 | PRINTING PLATE LOADING/UNLOADING UNIT | UNLOAD PRINTING PLATE |
| | 13-4 | PRINTING PLATE SHUTTER 18 | CLOSE |
| | 13-5 | PRINTING PLATE SHUTTLE 25L | MOVE TO MIDDLE POSITION XP22 |
| S14 | 14-1 | SUBSTRATE SHUTTLE 25R | MOVE TO SUBSTRATE TRANSFER POSITION XP25 |
| | 14-2 | SUBSTRATE SHUTTER 19 | OPEN |
| | 14-3 | SUBSTRATE LOADING/UNLOADING UNIT | UNLOAD SUBSTRATE |
| | 14-4 | SUBSTRATE SHUTTER 19 | CLOSE |
| | 14-5 | SUBSTRATE SHUTTLE 25R | MOVE TO MIDDLE POSITION XP24 |

(b)

PATTERN FORMING APPARATUS AND PATTERN FORMING METHOD

CROSS REFERENCE TO RELATED APPLICATION

The disclosure of Japanese Patent Application No. 2011-261823 filed on Nov. 30, 2011 including specification, drawings and claims is incorporated herein by reference in its entirety.

BACKGROUND OF THE INVENTION

1. Field of the Invention

The present invention relates to an apparatus and a method for bringing a blanket into contact with a plate-like object to form a pattern on the blanket by the object or on the object by the blanket.

2. Description of the Related Art

An invention disclosed, for example, in JP2010-158799A is conventionally known as an invention for producing an electronic component using the above pattern forming method. In the invention disclosed in JP2010-158799A, a pattern of a printing plate is transferred to a blanket by pressing the blanket into contact with the printing plate, whereby a pattern is formed on the blanket (first transfer step). Thereafter, the pattern on the blanket is transferred to a substrate by pressing the blanket into contact with the substrate, whereby a pattern is formed on the substrate (second transfer step).

SUMMARY OF THE INVENTION

In the case of pressing a blanket into a plate-like object such as a printing plate and a substrate, a contact area needs to be stably widened toward end edge sides after a central portion of the blanket is brought into contact with the object. This is because, if the blanket is not partly brought into contact with the object and has a non-contact portion and a contact portion that encloses the non-contact portion, an air bubble is trapped in the non-contact portion. That is, the residual air bubble is present between the blanket and the object, which blocks pattern formation. Accordingly, there is a demand for a technology of stably forming a pattern by satisfactorily bringing a blanket into contact with an object.

The invention is developed in view of the above problem and aims to provide a pattern forming apparatus and a pattern forming method capable of stably forming a pattern.

A pattern forming apparatus according to an aspect the invention comprises: a first holder that holds a plate-like object; a second holder, including a flat surface facing the object held by the first holder and a plurality of openings formed in the flat surface, that is adapted to hold a blanket with the flat surface by suction; a positive pressure supplier that supplies a positive pressure to each opening; a negative pressure supplier that supplies a negative pressure to each opening; and a controller that controls the supply of the positive pressure by the positive pressure supplier and the supply of the negative pressure by the negative pressure supplier for each of the openings, wherein the plurality of openings include a first opening and a plurality of second openings, and the plurality of second openings include a third opening adjacent to the first opening; the controller supplies the positive pressure to the first opening to lift a portion of the blanket from the flat surface so that the lifted portion is brought into contact with the object while supplying the negative pressure to the plurality of second openings to hold the blanket by suction; and the controller stops supplying the negative pressure to the third opening so as to widen an area of the blanket brought into contact with the object.

A pattern forming method according to an aspect the invention comprises: a first step of holding a plate-like object by a first holder; a second step of holding a blanket with a flat surface of a second holder facing the object held by the first holder, the flat surface having plurality of openings that include a first opening and a plurality second openings; a third step of supplying a positive pressure to the first opening to lift a portion of the blanket from the flat surface and bring the lifted portion into contact with the object while supplying the negative pressure to the plurality of second openings to hold the blanket by suction; and a fourth step of stopping the supply of the negative pressure to a third opening so as to widen an area of the blanket brought into contact with the object, the third opening being included in the plurality of second openings and adjacent to the first opening.

In the invention thus configured (pattern forming apparatus and pattern forming method), the positive pressure is supplied to the first opening to lift a portion of the blanket from the flat surface and bring the lifted portion into contact with the object while the negative pressure is supplied to the plurality of second openings formed in the flat surface of the second holder to hold the blanket by suction. The portion of the blanket is partly in contact with the object in this contact state. When the supply of the negative pressure to the third opening is stopped, a force for holding the blanket becomes gradually weaker against a pressure force in an already lifted space, i.e. a space enclosed by the lifted portion of the blanket and the flat surface (hereinafter, referred to as a "pressurized space") near the third opening. Associated with that, a gas component in the pressurized space flows into a space between a portion of the blanket corresponding to the third opening and the flat surface to lift the blanket portion from the flat surface and bring it into contact with the object. Thus, it is possible to suppress a sudden change of the pressure in the above pressurized space and slowly and stably widen an area of the blanket brought into contact with the object (hereinafter, referred to as a "contact area"). As a result, without generating residual air bubbles, pattern formation on the blanket by the object and pattern formation on the object by the blanket can be satisfactorily performed.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 4A is a perspective view showing the upper stage unit equipped in the printing apparatus of FIG. 1;

FIG. 4B is a sectional view of the upper stage unit shown in FIG. 4A;

FIGS. 13 to 19 are charts showing the operation of the printing apparatus of FIG. 1;

DETAILED DESCRIPTION OF THE PREFERRED EMBODIMENTS

Here, after the overall configuration of a printing apparatus equipped with an embodiment of a pattern forming apparatus according to the invention is first described, the configuration and operation of each unit of the apparatus are described in detail. Then, pattern forming apparatus and method according to the invention will be described in detail.

A. Overall Configuration of Apparatus

Figure 1:
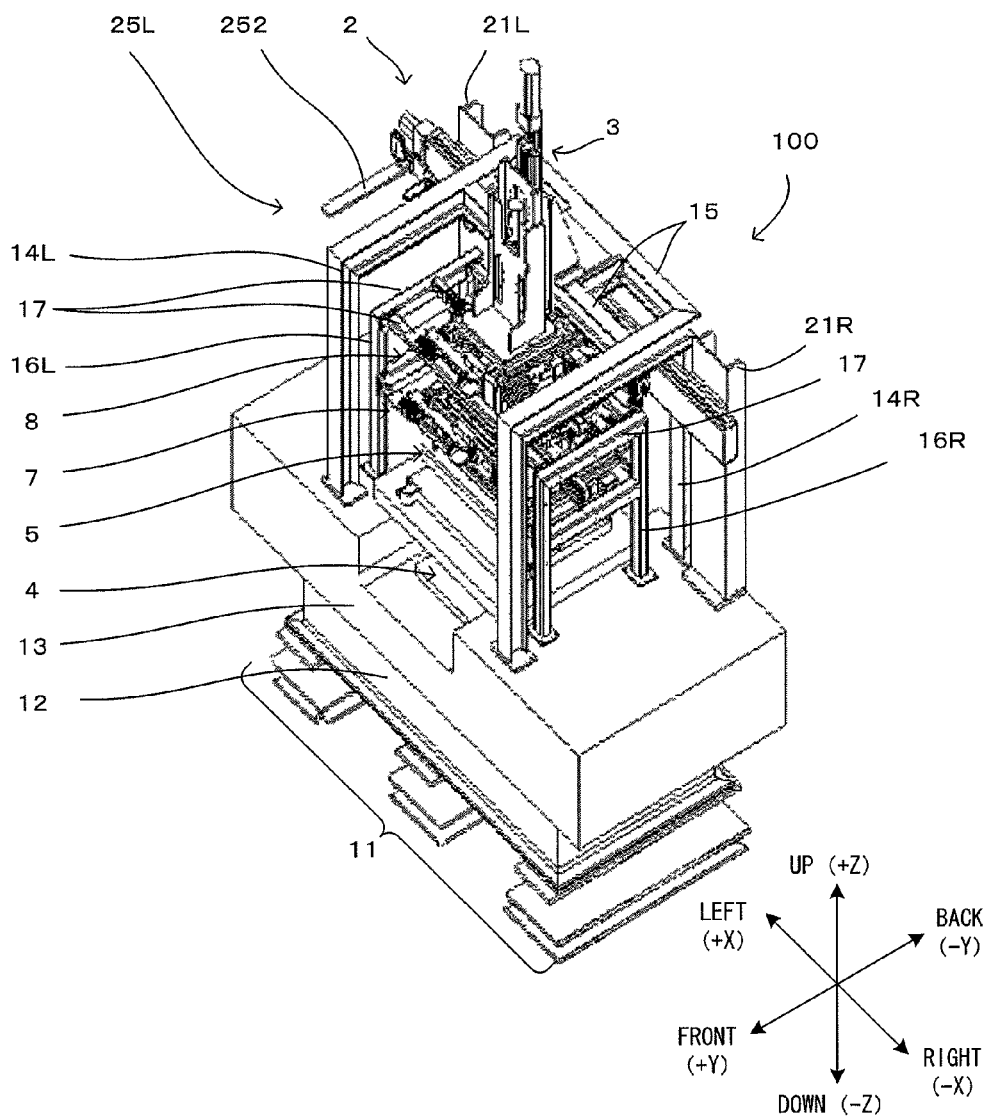
FIG. 1 is a perspective view showing a printing apparatus equipped with an embodiment of a pattern forming apparatus according to the invention.
Figure 2:
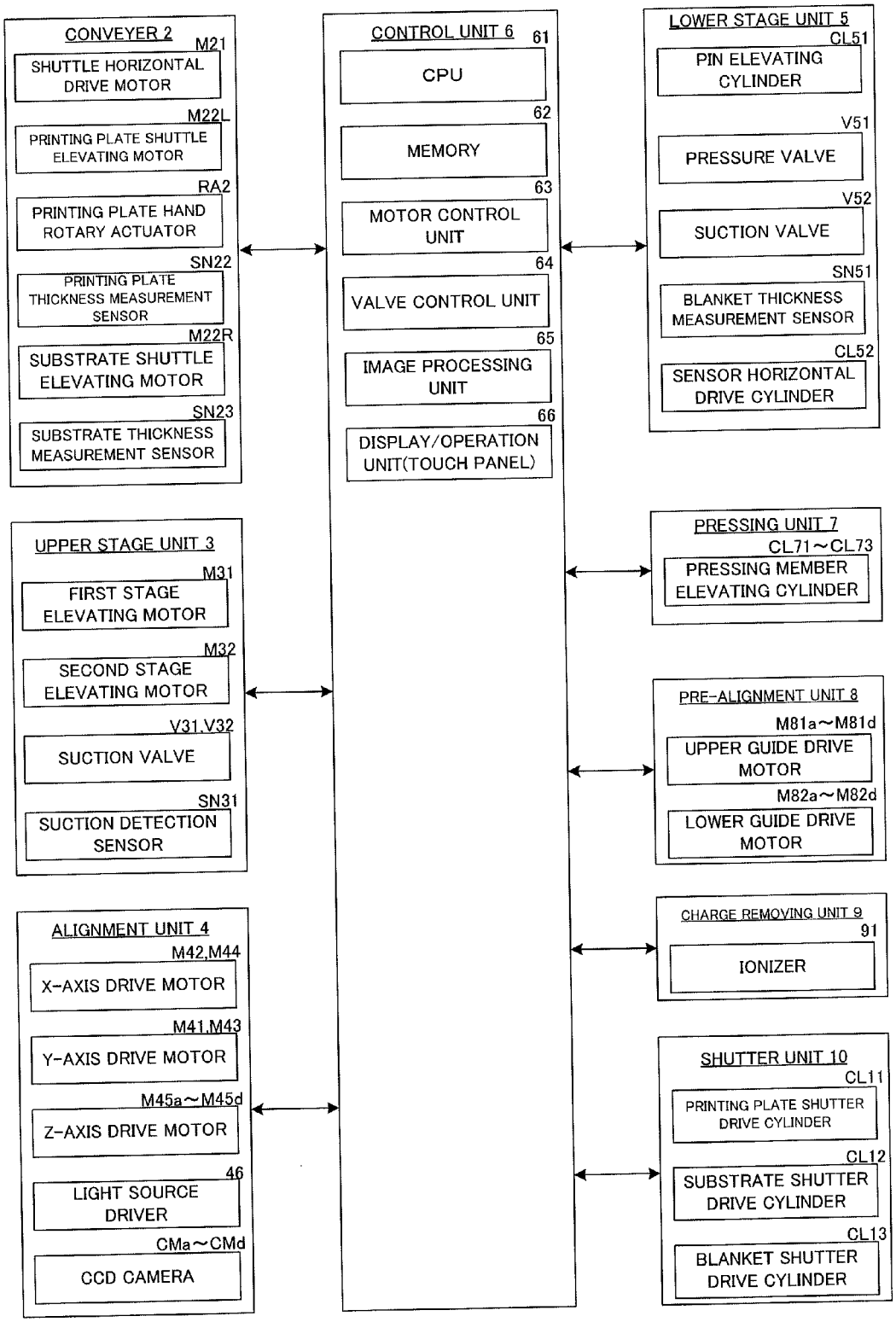
FIG. 2 is a block diagram showing the electrical configuration of the apparatus of FIG. 1.

FIG. 1 is a perspective view showing a printing apparatus equipped with an embodiment of a pattern forming apparatus according to the invention. In order to clearly show the internal configuration of the apparatus, FIG. 1 illustrates a state where apparatus covers are removed. FIG. 2 is a block diagram showing the electrical configuration of the apparatus of FIG. 1. A blanket is loaded from the front side of the printing apparatus 100 while a printing plate is loaded from the left side thereof. In the apparatus 100, the upper surface of the blanket is brought into close contact with the lower surface of a printing plate, and then the blanket is separated. Therefore, an application layer on the blanket is patterned by a pattern formed on the lower surface of the printing plate to form a pattern layer (patterning process). Further, a substrate is loaded into the apparatus 100 from the right side thereof. After the patterned upper surface of the blanket is brought into close contact with the lower surface of the substrate, the blanket is separated. Therefore, the pattern layer formed on the blanket is transferred to the lower surface of the substrate (transfer process). Note that, in FIG. 1 and each Figure described later, conveying directions of the printing plate and the substrate are referred to as "X directions" to clarify an arrangement relationship of the respective units of the apparatus 100. Furthermore, a horizontal direction from the right side toward the left side in FIG. 1 is referred to as a "+X direction" and an opposite direction is referred to as a "−X direction". Out of horizontal directions perpendicular to the X directions, a direction toward the front side of the apparatus 100 is referred to as a "+Y direction" and a direction toward the rear side of the apparatus 100 is referred to as a "−Y direction". A vertically upward direction and a vertically downward direction are respectively referred to as a "+Z direction" and a "−Z direction".

In the printing apparatus 100, a main body base 12 is placed on a spring-type vibration isolation table 11 and a stone plate 13 is further mounted on the main body base 12. Further, two arched frames 14L, 14R stand in the center of the upper surface of the stone plate 13 while being spaced apart in the X direction. Two horizontal plates 15 are coupled to upper end portions of these arched frames 14L, 14R at a (−Y) side to form a first frame structure. Further, a second frame structure is provided on the upper surface of the stone plate 13 to be covered by the first frame structure. More specifically, as shown in FIG. 1, arched frames 16L, 16R smaller than the frames 14L, 14R stand on the stone plate 13 at positions right below the respective arched frames 14L, 14R. A plurality of horizontal plates 17 extending in the X direction connect column parts of the respective frames 16L, 16R and a plurality of horizontal plates 17 extending in the Y direction connect the frames 16L, 16R.

Between the thus configured frame structures, conveyance spaces are formed between beam parts of the frames 14L, 16L and between beam parts of the frames 14R, 16R. The printing plate and the substrate can be conveyed via these conveyance spaces while being held in a horizontal posture. A conveyance unit 2 is provided behind the second frame structure, i.e. at the (−Y) side and the printing plate and the substrate can be conveyed in the X direction.

An upper stage unit 3 is fixed to the horizontal plate 15 forming the first frame structure and can suck and hold the upper surfaces of the printing plate and the substrate conveyed by the conveyance unit 2. That is, after the printing plate is conveyed to a position right below the upper stage unit 3 via the conveyance space from the left side of FIG. 1 by a printing plate shuttle of the conveyance unit 2, a suction plate of the upper stage unit 3 is lowered to hold the substrate by suction. Conversely, when the suction plate of the upper stage unit 3 releases suction after the substrate is sucked with the printing plate shuttle located at the position right below the upper stage unit 3, the printing plate is transferred to the conveyance unit 2. In this way, the printing plate is transferred between the conveyance unit 2 and the upper stage unit 3.

Further, the substrate is also held by the upper stage unit 3 similarly to the printing plate. That is, after the substrate is conveyed to the position right below the upper stage unit 3 via the conveyance space from the right side of FIG. 1 by a substrate shuttle of the conveyance unit 2, the suction plate of the upper stage unit 3 is lowered to hold the substrate by suction. Conversely, when the suction plate of the upper stage unit 3 releases suction after the substrate is sucked with the substrate shuttle located at the position right below the upper stage unit 3, the substrate is transferred to the conveyance unit 2. In this way, the substrate is transferred between the conveyance unit 2 and the upper stage unit 3.

Below the upper stage unit 3 in the vertical direction (hereinafter, referred to as "vertically below" or "(−Z) direction"), an alignment unit 4 is arranged on the upper surface of the stone plate 13. A lower stage unit 5 is placed on an alignment stage of the alignment unit 4 and the upper surface of the lower stage unit 5 faces the suction plate of the upper stage unit 3. The upper surface of the lower stage unit 5 can hold a blanket by suction, and the blanket on the lower stage unit 5 can be positioned with high accuracy by a control unit 6 controlling the alignment stage.

As just described, the upper stage unit 3 and the lower stage unit 5 are arranged to face each other in the vertical direction Z. Between them, a pressing unit 7 for pressing the blanket placed on the lower stage unit 5 from above and a pre-alignment unit 8 for pre-aligning the printing plate, the substrate and the blanket are respectively arranged and fixed to the second frame structure.

The pre-alignment unit 8 includes a pre-alignment upper part and a pre-alignment lower part that are arranged in two levels in the vertical direction Z. The pre-alignment upper part accesses to the printing plate held by the printing plate shuttle positioned at the position right below the suction plate of the upper stage unit 3 and positions the printing plate on the printing plate shuttle (printing plate pre-alignment process). Further, the pre-alignment upper part accesses to a substrate SB held by the substrate shuttle positioned at the position right below the suction plate and positions the substrate on the substrate shuttle (substrate pre-alignment process). The pre-alignment lower part accesses to the blanket placed on a suction plate of the lower stage unit 5 and positions the blanket on the suction plate (blanket pre-alignment process).

To precisely transfer a pattern layer on the blanket to the substrate, a precise alignment process is necessary besides the substrate pre-alignment process. Thus, the alignment unit 4 includes four CCD (Charge Coupled Device) cameras CMa to CMd and can read alignment marks formed on each of the substrate held by the upper stage unit 3 and the blanket held by the lower stage unit 5 by the respective CCD cameras CMa to CMd. Then, the control unit 6 controls the alignment stage based on images read by the CCD cameras CMa to CMd, whereby the blanket sucked by the lower stage unit 5 can be precisely positioned with respect to the substrate held by the upper stage unit 3.

After the pattern layer on the blanket is transferred to the substrate, the blanket is separated from the substrate. In that separation stage, static electricity is generated. Static electricity is produced also when the blanket is separated from the printing plate after the application layer on the blanket is patterned by the printing plate. Accordingly, a static eliminator 9 is provided to eliminate static electricity. The static eliminator 9 includes an ionizer 91 for irradiating ions toward a space between the upper stage unit 3 and the lower stage unit 5 from the left side of the first frame structure, i.e. from the (+X) side.

Note that, although not shown in FIG. 1, a (+X) side cover out of the apparatus covers is provided with an opening used to load and unload the printing plate and a printing plate shutter (18 in FIG. 13 to be described later) for opening and closing the opening for the printing plate. A valve control unit 64 of the control unit 6 switches the opening and closing of a valve connected to a printing plate shutter drive cylinder CL11, thereby actuating the printing plate shutter drive cylinder CL11 to drivingly open and close the printing plate shutter. Note that, pressurized air is used as a drive source for driving the cylinder CL11 and a factory's utility is used as its positive pressure supply source. The apparatus 100 may be equipped with an air supply unit and the cylinder CL11 may be driven by the air supply unit. This point equally applies also to cylinders to be described later.

Further, a (−X) side cover and a (+Y) side cover are respectively formed with openings for loading and unloading the substrate and the blanket, and a substrate shutter (19 in FIG. 13 to be described later) and a blanket shutter (not shown) are respectively provided for the substrate opening and the blanket opening. By opening and closing valves by the valve control unit 64, a substrate shutter drive cylinder CL12 and a blanket shutter drive cylinder CL13 are respectively driven to open and close the shutters.

As just described, a shutter unit 10 is formed by three shutters and three shutter drive cylinders CL11 to CL13, and the printing plate, the substrate and the blanket can be respectively independently loaded into and unloaded from the printing apparatus 100. Note that, although not shown in FIG. 1, a printing plate loading/unloading unit for loading and unloading the printing plate is juxtaposed at the left side of the apparatus 100 and a substrate loading/unloading unit for loading and unloading the substrate is juxtaposed at the right side of the apparatus 100 in this embodiment. Alternatively, a conveyance robot (not shown) for conveying the printing plate may directly access to the printing plate shuttle of the conveyance unit 2 and load and unload the printing plate. In the case, the installation of the printing plate loading/unloading unit is not necessary. This point equally applies to the substrate side. That is, a conveyance robot (not shown) for conveying the substrate may directly access to the substrate shuttle of the conveyance unit 2 and load and unload the substrate, whereby the installation of the substrate loading/unloading unit is not necessary.

On the other hand, in this embodiment, a conveyance robot for conveying the blanket is used to load and unload the blanket. That is, the conveyance robot accesses to the lower stage unit 5 to directly load the blanket before the process and receive and unload the blanket after the use. Of course, it goes without saying that a dedicated loading/unloading unit may be arranged at the front side of the apparatus as for the printing plate and the substrate.

B. Configuration of Each Unit of Apparatus

B-1. Conveyance Unit 2

Figure 3:
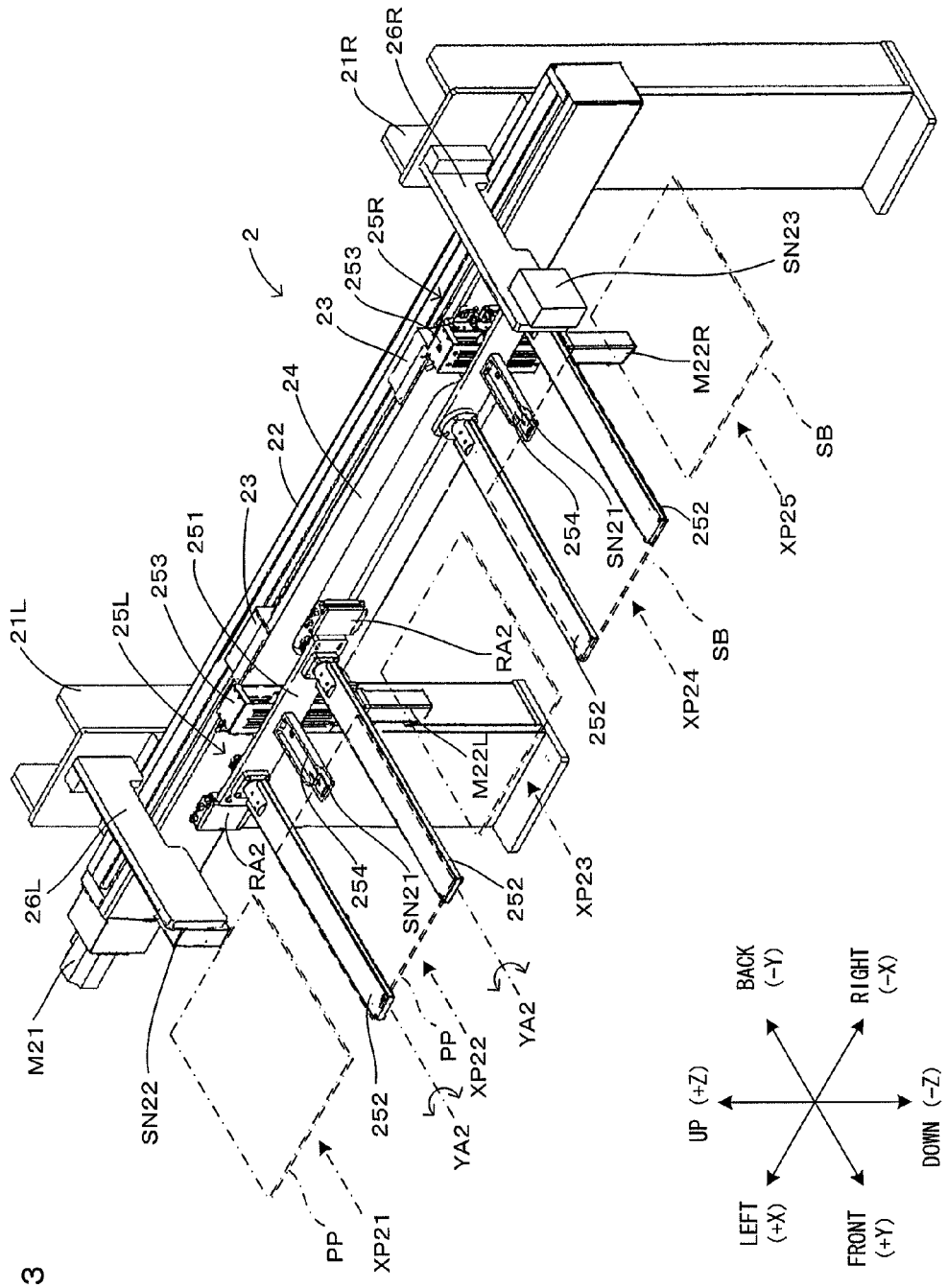
FIG. 3 is a perspective view showing the conveyance unit equipped in the printing apparatus of FIG. 1.

FIG. 3 is a perspective view showing the conveyance unit equipped in the printing apparatus of FIG. 1. The conveyance unit 2 includes two brackets 21L, 21R extending in the vertical direction Z. As shown in FIG. 1, the bracket 21L stands on the upper surface of the stone plate 13 adjacent to and to the left of a rear column part of the left frame 14L, and the bracket 21T stands on the upper surface of the stone plate 13 adjacent to and to the right of a rear column part of the right frame 14R. As shown in FIG. 3, a ball screw mechanism 22 extends in a lateral direction, i.e. in the X direction to couple upper end portions of these brackets 21L, 21R to each other. In the ball screw mechanism 22, a ball screw (not shown) extends in the X direction and a rotary shaft (not shown) of a shuttle horizontal drive motor M21 for horizontally driving shuttles is coupled to one end thereof. Two ball screw brackets 23, 23 are threadably engaged with a central portion of the ball screw. A shuttle holding plate 24 extending in the X direction is mounted on side surfaces of these ball screw brackets 23, 23 facing toward the (+Y) side.

A printing plate shuttle 25L is provided on a (+X) side end portion of the shuttle holding plate 24 to be movable upward and downward in the vertical direction Z, whereas a substrate shuttle 25R is provided on a (−X) side end portion to be movable upward and downward in the vertical direction Z. Since these shuttles 25L, 25R have the same configuration except for a hand rotation mechanism, the configuration of the printing plate shuttle 25L is described and that of the substrate shuttle 25R is denoted by the same or equivalent reference signs and not described here.

The shuttle 25L includes an elevating plate 251 and two printing plate hands 252, 252. The elevating plate 251 extends in the X direction and has a length about equal to or slightly longer than a width size (X-direction size) of the printing plate PP. The two printing plate hands 252, 252 respectively extend forward, i.e. toward the (+Y) side from an (+X) side end portion and a (−X) side end portion of the elevating plate 251. The elevating plate 251 is mounted on an (+X) side end portion of the shuttle holding plate 24 via a ball screw mechanism 253 to be movable upward and downward. That is, the ball screw mechanism 253 extends in the vertical direction Z with respect to the (+X) side end portion of the shuttle holding plate 24. A rotary shaft (not shown) of a printing plate shuttle elevating motor M22L is coupled to the lower end of the ball screw mechanism 253. Further, a ball screw bracket (not shown) is threadably engaged with the ball screw mechanism 253 and the elevating plate 251 is mounted on a (+Y) side surface of the ball screw bracket. Thus, the printing plate shuttle elevating motor M22L operates in response to an operation command from a motor control unit 63 of the control unit 6, whereby the elevating plate 251 is driven to move upward and downward in the vertical direction Z.

A front-back size (Y-direction size) of the respective hands 252, 252 is longer than a length size (Y-direction size) of the printing plate PP so that the printing plate PP can be held by leading end sides (+Y sides) of the respective hands 252, 252.

To detect the holding of the printing plate PP by the printing plate hands 252, 252 in this way, a sensor bracket 254 extends toward the (+Y) side from a central portion of the elevating plate 251 and a sensor SN21 for detecting the printing plate is mounted on a leading end portion of the sensor bracket 254. Thus, when the printing plate PP is placed on the both hands 252, the sensor SN 21 detects a rear end portion, i.e. a (−Y) side end portion of the printing plate PP and outputs a detection signal to the control unit 6.

Each of the printing plate hands 252, 252 is mounted on the elevating plate 251 via a bearings (not shown) and rotatable about an axe of rotation YA2 extending in a front-back direction (Y-direction). Rotary actuators RA2, RA2 are mounted on both ends of the elevating plate 251 in the X direction. These rotary actuators RA2, RA2 operate using pressurized air as a drive source and are rotatable by the 180 degree by opening and closing a valve (not shown) inserted in a pressurized air supply path. Thus, by controlling the opening and closing of the valves using the valve control unit 64 of the control unit 6, a switch can be made between an unused posture and a used posture. The unused posture is one hand posture in which one principle surface of each printing plate hand 252 faces upward to be suited to handling the printing plate PP before patterning. The used posture is other hand posture in which the other principle surface faces upward to be suited to handling the printing plate PP after patterning. The printing plate shuttle 25L differs from the substrate shuttle 25R only in including such a hand posture switching mechanism.

Next, mount positions of the printing plate shuttle 25L and the substrate shuttle 25R with respect to the shuttle holding plate 24 are described. As shown in FIG. 3, the shuttles 25L, 25R are mounted on the shuttle holding plate 24 while being spaced apart in the X direction by a distance longer than the width sizes of the printing plate PP and the substrate SB. Note that the width sizes of the printing plate PP and the substrate SB are equal in this embodiment. When the rotary shaft of the shuttle horizontal drive motor M21 is rotated in a predetermined direction, the both shuttles 25L, 25R move in the X direction while keeping the above separation distance. For example, in FIG. 3, a position right below the upper stage unit 3 is denoted by XP23 and the shuttles 25L, 25R are located at positions XP22, XP24 respectively at the same distance (this distance is referred to as a "step movement unit") in the (+X) direction and the (−X) direction from the position XP23. Note that a state shown in FIG. 3 is referred to as a "middle position state" in this embodiment.

When the shuttle holding plate 24 is moved by the step movement unit in the (+X) direction by rotating the rotary shaft of the shuttle horizontal drive motor M21 in a predetermined direction in this middle position state, the substrate shuttle 25R is moved in the (+X) direction to the position XP23 right below the upper stage unit 3 and positioned. At this time, the printing plate shuttle 25L is also integrally moved in the (+X) direction and positioned at a position XP21 close to the printing plate loading/unloading unit.

Conversely, when the shuttle holding plate 24 is moved by the step movement unit in the (−X) direction by rotating the rotary shaft of the shuttle horizontal drive motor M21 in a direction opposite to the predetermined direction, the printing plate shuttle 25L is, in the middle position state, moved in the (−X) direction to the position XP23 right below the upper stage unit 3 and positioned. At this time, the substrate shuttle 25R is also integrally moved in the (−X) direction and positioned at a position XP25 proximate to the substrate loading/unloading unit. As just described, in this specification, five positions XP21 to XP25 are specified as shuttle positions in the X direction. That is, the printing plate transfer position XP21 is a position closest to the printing plate loading/unloading unit out of the three positions XP21 to XP23 to which the printing plate shuttle 25L is positioned. This means that the position XP21 is an X-direction position where the printing plate PP is loaded from and unloaded to the printing plate loading/unloading unit. The substrate transfer position XP25 is a position closest to the substrate loading/unloading unit out of the three positions XP23 to XP25 to which the substrate shuttle 25R is positioned. This means that the position XP25 is an X-direction position where the substrate SB is loaded from and unloaded to the substrate loading/unloading unit. Further, the position XP23 is an X-direction position where a suction plate 37 of the upper stage unit 3 moves in the vertical direction to hold the printing plate PP or the substrate SB by suction. In this specification, the X-direction position XP23 is referred to as a "printing plate suction position XP23" when the printing plate shuttle 25L is located at the position XP23, whereas the X-direction position XP23 is referred to as a "substrate suction position XP23" when the substrate shuttle 25R is located at the position XP23. Further, a position in the vertical direction Z, i.e. a height position where the printing plate PP and the substrate SB are conveyed by the shuttles 25L, 25R is referred to as a "conveyance position".

The thickness of the printing plate PP needs to be measured to accurately control a gap amount between the printing plate PP and the blanket at the time of patterning. The thickness of the substrate SB also needs to be measured to accurately control a gap amount between the substrate SB and the blanket at the time of transfer. Accordingly, a printing plate thickness measurement sensor SN22 and a substrate thickness measurement sensor SN23 are provided.

More specifically, as shown in FIG. 3, a sensor bracket 26L extending forward, i.e. toward the (+Y) side is mounted on the left bracket 21L and a leading end portion of the sensor bracket 26L extends to above the printing plate PP positioned at the position XP21. The printing plate thickness measurement sensor SN22 is mounted on the leading end portion of the sensor bracket 26L. The sensor SN22 includes a light emitter and a light receiver and measures two distances. That is, the sensor SN22 measures a distance from the sensor SN22 to the upper surface of the printing plate PP based on light reflected by the upper surface of the printing plate PP and measures a distance from the sensor SN22 to the lower surface of the printing plate PP based on light reflected by the lower surface of the printing plate PP. Information on the distances is output from the sensor SN22 to the control unit 6. Thus, in the control unit 6, the thickness of the printing plate PP can be accurately calculated from these pieces of distance information.

The substrate thickness measurement sensor SN23 is provided for the substrate side in the same manner for the printing plate side. That is, a sensor bracket 26R is mounted on the right bracket 21R and a leading end portion of the sensor bracket 26R extends to above the substrate SB positioned at the position XP25. The substrate thickness measurement sensor SN23 is mounted on the leading end portion of the sensor bracket 26R and measures the thickness of the substrate SB.

B-2. Upper Stage Unit 3

FIG. 4A is a perspective view showing the upper stage unit equipped in the printing apparatus of FIG. 1. FIG. 4B is a sectional view of the upper stage unit shown in FIG. 4A. The upper stage unit 3 is arranged above the printing plate PP or the substrate SB positioned at the position XP23 (see FIG. 3). A supporting frame 31 is coupled to the horizontal plate 15 to be supported on the first frame structure. As shown in FIGS. 4A and 4B, the supporting frame 31 has a frame side surface extending in the vertical direction Z. A ball screw mechanism 32 extending in the vertical direction Z is supported on the frame side surface. A rotary shaft (not shown) of a first stage elevating motor M31 is coupled to an upper end portion of the ball screw mechanism 32. A ball screw bracket 321 is threadably engaged with the ball screw mechanism 32.

Another supporting frame 33 is fixed to the ball screw bracket 321 and movable upward and downward in the vertical direction Z together with the ball screw bracket 321. Further, another ball screw mechanism 34 is supported on a frame surface of the supporting frame 33. The ball screw mechanism 34 includes a ball screw at narrower pitches than that of the ball screw mechanism 32. With respect to the narrow pitch ball screw, a rotary shaft (not shown) of a second stage elevating motor M32 is coupled to an upper end portion thereof and a ball screw bracket 341 is threadably engaged with a central portion thereof.

A stage holder 35 is mounted to the ball screw bracket 341. The stage holder 35 is composed of three vertical plates 351 to 353 extending in the vertical direction Z. Out of these, the vertical plate 351 is fixed to the ball screw bracket 341 and the remaining vertical plates 352, 353 are respectively fixed to the left and right sides of the vertical plate 351. A horizontal supporting plate 36 is mounted to vertical lower ends of the vertical plates 351 to 353, and the suction plate 37 made of metal, e.g. aluminum alloy is mounted to the lower surface of the horizontal supporting plate 36.

Accordingly, the stage elevating motors M31, M32 operate in response to an operation command from the motor control unit 63 of the control unit 6, whereby the suction plate 37 is moved upward and downward in the vertical direction Z. By combining the ball screw mechanisms 32, 34 having different pitches and operating the first stage elevating motor M31, the suction plate 37 is moved upward and downward at a relatively wide pitch, i.e. the suction plate 37 can be moved at a high speed. In addition, by operating the second stage elevating motor M32, the suction plate 37 is moved upward and downward at a relatively narrow pitch, i.e. the suction plate 37 can be precisely positioned.

A plurality of suction grooves 371 are provided in the lower surface of the suction plate 37, i.e. in a suction surface for sucking and holding the printing plate PP or the substrate SB. A plurality of suction pads 38 are arranged in a plurality of cutouts 373 provided on the outer peripheral edge of the suction plate 37 and a central portion of the suction plate 37. Note that nozzle bodies for supporting the suction pads 38 are supported by the horizontal supporting plate 36, a nozzle supporting plate 39 and the like so that the leading end surfaces of the suction pads 38 are flush with the lower surface of the suction plate 37. Out of the suction pads 38, those arranged in the central portion of the suction plate 37 (not shown) are auxiliary ones for improving suction strength. It is also possible not to provide such auxiliary suction pads.

As just described, the suction grooves 371 and the suction pads 38 are provided as a suction means for sucking and holding the printing plate PP and the substrate SB and respectively connected to a negative pressure supply source via negative pressure supply paths for independently supplying a negative pressure. Valves V31 (FIG. 2) are inserted in the negative pressure supply paths for the suction grooves while valves V32 (FIG. 2) are inserted in the negative pressure supply paths for the suction pads. By controlling the opening and closing of the valves V31 in response to an opening/closing command from the valve control unit 64 of the control unit 6, the printing plate PP and the substrate SB can be sucked by the suction grooves 371. Further, by controlling the opening and closing of valves V32 in response to an opening/closing command from the valve control unit 64, the printing plate PP and the substrate SB can be sucked by the suction pads 38. Although a factory's utility is used as the negative pressure supply source to hold the printing plate, the substrate and the blanket in this embodiment, the apparatus 100 may be equipped with a negative pressure supply unit such as a vacuum pump and a negative pressure.

B-3. Alignment Unit 4

Figure 5:
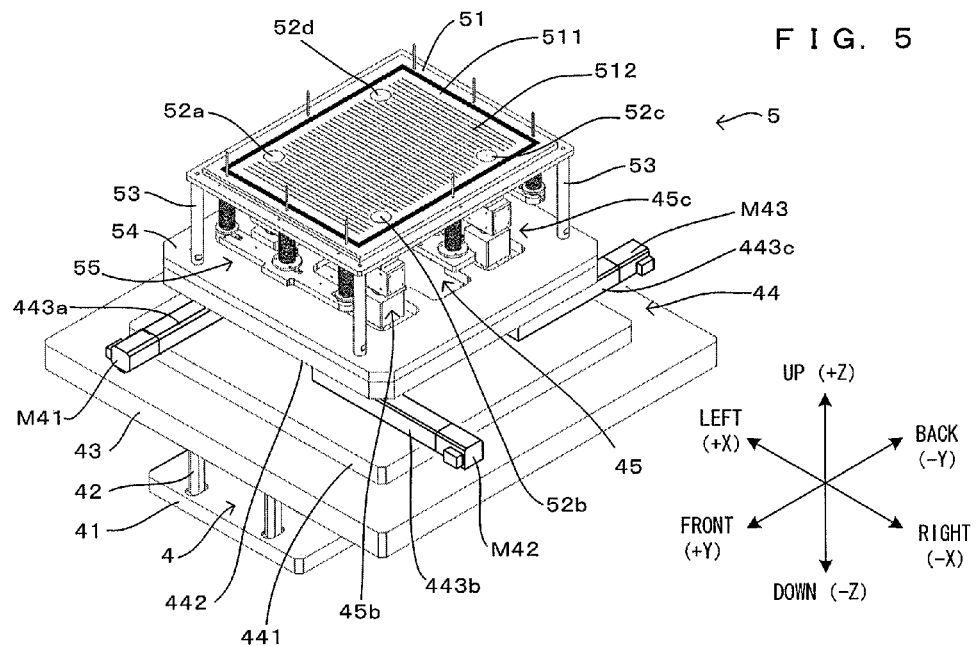
FIG. 5 is a perspective view showing the alignment unit and the lower stage unit equipped in the printing apparatus of FIG. 1.

FIG. 5 is a perspective view showing the alignment unit and the lower stage unit equipped in the printing apparatus of FIG. 1. As shown in FIG. 1, the alignment unit 4 and the lower stage unit 5 are arranged vertically below the upper stage unit 3. The alignment unit 4 includes a camera mount base 41, four column members 42, a frame-shaped stage supporting plate 43 provided with an opening in a central portion, an alignment stage 44 and an imaging device 45. As shown in FIG. 1, the camera mount base 41 is fixed to the inner bottom surface of a recess formed in a central portion of the upper surface of the stone plate 13. Further, two column members 42 stand upward in the vertical direction (referred to as "vertically upward" or "(+Z) direction") from each of front and rear end portions of the camera mount base 41, and handling ability of the camera mount base 41 is improved by these.

As shown in FIG. 1, the stage supporting plate 43 is arranged in a horizontal posture to cross over the recess of the stone plate 13 and fixed to the upper surface of the stone plate 13 with the central opening of the stage supporting plate 43 and the camera mount base 41 facing each other. Further, the alignment stage 44 is fixed to the upper surface of the stage supporting plate 43.

The alignment stage 44 includes a stage base 441 and a stage top 442. The stage base 441 is fixed onto the stage supporting plate 43. The stage top 442 is arranged vertically above the stage base 441 so as to support the lower stage unit 5. Each of these stage base 441 and stage top 442 is in the form of a frame having an opening in a central portion. A supporting mechanism (not shown), e.g. a cross roller bearing, having three degrees of freedom in a rotating direction about an axis of rotation extending in the vertical direction Z, the X direction and the Y direction is arranged near each corner of the stage top 442 between the stage base 441 and the stage top 442.

A Y-axis ball screw mechanism 443a is provided on the supporting mechanism arranged at the front-left corner out of these supporting mechanisms, and a Y-axis drive motor M41 is mounted to the Y-axis ball screw mechanism 443a. An X-axis ball screw mechanism 443b is provided on the supporting mechanism arranged at the front-right corner, and an X-axis drive motor M42 is mounted to the X-axis ball screw mechanism 443b. A Y-axis ball screw mechanism 443c is provided on the supporting mechanism arranged at the rear-right corner, and a Y-axis drive motor M43 is mounted to the Y-axis ball screw mechanism 443c. Further, an X-axis ball screw mechanism (not shown) is provided on the supporting mechanism arranged at the rear-left corner, and an X-axis drive motor M44 (FIG. 2) is mounted to the X-axis ball screw mechanism. Thus, by operating the respective drive motors M41 to M44 in response to an operation command from the motor control unit 63 of the control unit 6, the stage top 442 is moved in a horizontal plane while a relatively large space is provided in a central portion of the alignment stage 44. Further, the suction plate of the lower stage unit 5 can be positioned by being rotated about a vertical axis.

One reason using the alignment stage 44 having a hollow space in this embodiment is to image alignment marks formed on the blanket held on the upper surface of the lower stage unit 5 and the substrate SB held on the lower surface of the upper stage unit 3 by the imaging device 45. The configuration of the imaging device 45 is described below with reference to FIGS. 5 and 6.

Figure 6:
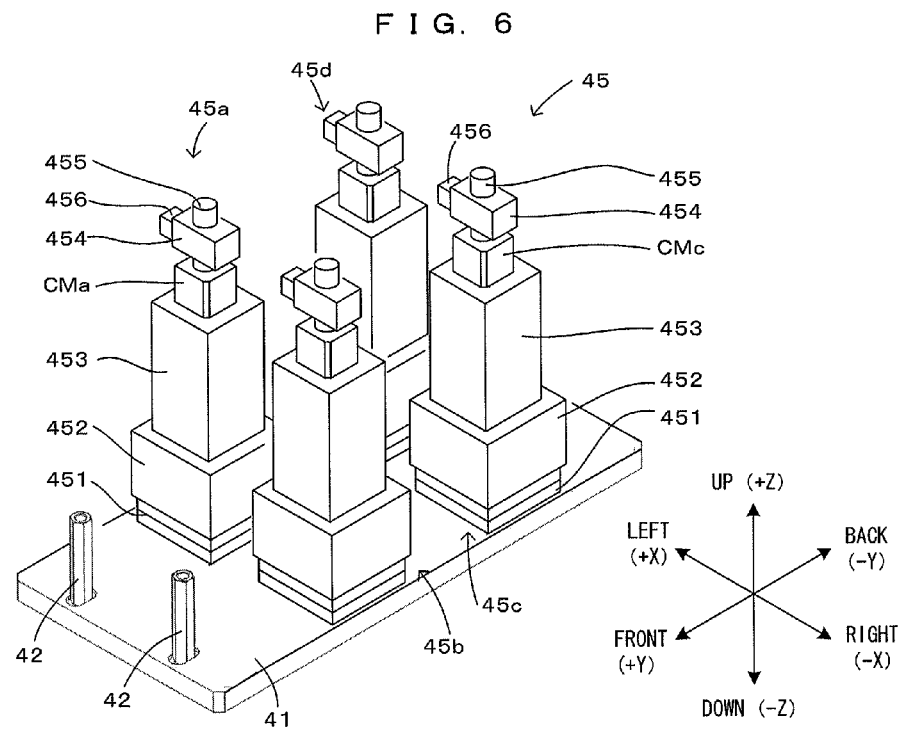
FIG. 6 is a perspective view showing the imaging device of the alignment unit.

FIG. 6 is a perspective view showing the imaging device of the alignment unit. The imaging device 45 is for imaging alignment marks respectively formed at four positions of the blanket and alignment marks respectively formed at four positions of the substrate SB and includes four imaging units 45a to 45d. Imaging target areas of the respective imaging units 45a to 45d are as follows.

Imaging unit 45a: area near the front-left corners of the blanket and the substrate SB Imaging unit 45b: area near the front-right corners of the blanket and the substrate SB Imaging unit 45c: area near the rear-right corners of the blanket and the substrate SB Imaging unit 45d: area near the rear-left corners of the blanket and the substrate SB The imaging units 45a to 45d have different imaging target areas, but have the same configuration. Thus, the configuration of the imaging unit 45a is described and the other configurations are denoted by the same or equivalent reference signs and not described here.

In the imaging unit 45a, an XY table 451 is arranged on the upper surface near the front-left corner of the camera mount base 41 as shown in FIG. 6. A table base of the XY table 451 is fixed to the camera mount base 41 and a table top of the XY table 451 is precisely positioned in the X direction and the Y direction by manually operating an adjustment knob (not shown). A precision elevating table 452 is mounted on the table top. A Z-axis drive motor M45a (FIG. 2) is mounted to the precision elevating table 452 and operates in response to an operation command from the motor control unit 63 of the control unit 6, whereby the table top of the precision elevating table 452 moves upward and downward in the vertical direction Z.

A lower end portion of a camera bracket 453 extending in the vertical direction Z is fixed to the upper surface of the table top of the precision elevating table 452. Further, an upper end portion of the camera bracket 453 extends up to a position right below a suction plate 51 of the lower stage unit 5 through the central opening of the stage supporting plate 43, the central opening of the alignment stage 44 and an oblong opening (this will be described in detail later) of the stage base. The CCD camera CMa, a lens barrel 454 and an objective lens 455 are arranged one over another in this order on the upper end portion of the camera bracket 453 with an imaging surface faced vertically upward. Further, a light source 456 is mounted on a side surface of the lens barrel 454 and driven and turned on by a light source driver 46. Although a red LED (Light Emitting Diode) is used as the light source 456 in this embodiment, a light source corresponding to the materials of the blanket and the substrate SB and the like can be used. The objective lens 455 is mounted on the lens barrel 454. Further, a half mirror (not shown) is arranged in the lens barrel 454 so as to reflect illumination light irradiated from the light source 456 in the (+Z) direction and irradiate the blanket on the lower stage unit 5 via the objective lens 455 and a quartz window 52a provided in an area near the front-left corner of the suction plate 51. A part of the illumination light further irradiates the substrate SB sucked and held by the suction plate 37 of the upper stage unit 3 via the blanket. Note that since the blanket is made of a transparent material in this embodiment, the illumination light reaches the lower surface of the substrate SB through the blanket as described above.

Further, a part of the light emerging from the blanket and the substrate SB and propagating toward the (−Z) side is incident on the CCD camera CMa via the quartz window 52a, the objective lens 455 and the lens barrel 454. The CCD camera CMa images the alignment mark located vertically above the quartz window 52a. As just described, in the imaging unit 45a, illumination light is irradiated via the quartz window 52a, an image of the area near the front-left corners of the blanket and the substrate SB is captured via the quartz window 52a. An image signal corresponding to the captured image is output to an image processing unit 65 of the control unit 6. On the other hand, the other imaging units 45b to 45d respectively capture images via quartz windows 52b to 52d similarly to the imaging unit 45a.

B-4. Lower Stage Unit 5

Next, with reference back to FIG. 5, the configuration of the lower stage unit 5 is described in detail. The lower stage unit 5 includes the suction plate 51, the four quartz windows 52a to 52d, four column members 53, a stage base 54 and a lift pin unit 55. The stage base 54 is provided with three openings in the form of long holes extending in the lateral direction X and arranged in the front-back direction Y. The stage base 54 is fixed onto the alignment stage 44 so that these long openings and the central opening of the alignment stage 44 overlap when viewed from above. Further, upper parts (CCD cameras, lens barrels and objective lenses) of the imaging units 45a, 45b are loosely inserted into the front long opening, and upper parts (CCD cameras, lens barrels and objective lenses) of the imaging units 45c, 45d are loosely inserted into the rear long opening. Further, the column members 53 stand in the (+Z) direction from corners of the upper surface of the stage base 54 and tops thereof support the suction plate 51.

The suction plate 51 is a metal plate of, e.g. aluminum alloy, and the quartz windows 52a to 52d are respectively provided in areas near the front-left, front-right, rear-right and rear-left corners thereof. A groove 511 is provided in the upper surface of the suction plate 51 to enclose the quartz windows 52a to 52d. In an inner area enclosed by the groove 511, a plurality of grooves 512 extending in the lateral direction X except at the quartz windows 52a to 52d are provided at specified intervals in the front-back direction Y.

One end of a positive pressure supply pipe (not shown) is connected to each of these grooves 511, 512 and the other end thereof is connected to a pressurization manifold. A pressure valve V51 (FIG. 2) is inserted in an intermediate portion of each positive pressure supply pipe. Air of a predetermined pressure is obtained by adjusting pressurized air supplied from the factory's utility by a regulator. The adjusted pressurized air is constantly supplied to the pressurization manifold. Thus, when a desired pressure valve V51 is selectively opened in response to an operation command from the valve control unit 64 of the control unit 6, the adjusted pressurized air is supplied to the groove 511, 512 connected to the selected pressure valve V51.

It is possible to selectively supply not only the pressurized air, but also a negative pressure to each of the grooves 511, 512. That is, one end of a negative pressure supply pipe (not shown) is connected to each of the grooves 511, 512 and the other end thereof is connected to a negative pressure manifold. Further, a suction valve V52 (FIG. 2) is inserted in an intermediate portion of each negative pressure supply pipe. A negative pressure supply source is connected to the negative pressure manifold via a regulator and a negative pressure of a predetermined value is constantly supplied. Thus, when a desired suction valve V52 is selectively opened in response to an operation command from the valve control unit 64 of the control unit 6, the adjusted negative pressure is supplied to the groove 511, 512 connected to the selected suction valve V52.

As just described, it is possible to cause the suction plate 51 to partly or entirely suck the blanket by controlling the opening and closing of the valves V51, V52 and to partly raise the blanket and press the blanket against the printing plate PP or the substrate SB held by the upper stage unit 3 by partly supplying air between the suction plate 51 and the blanket and partly raising the blanket.

Figure 7A:
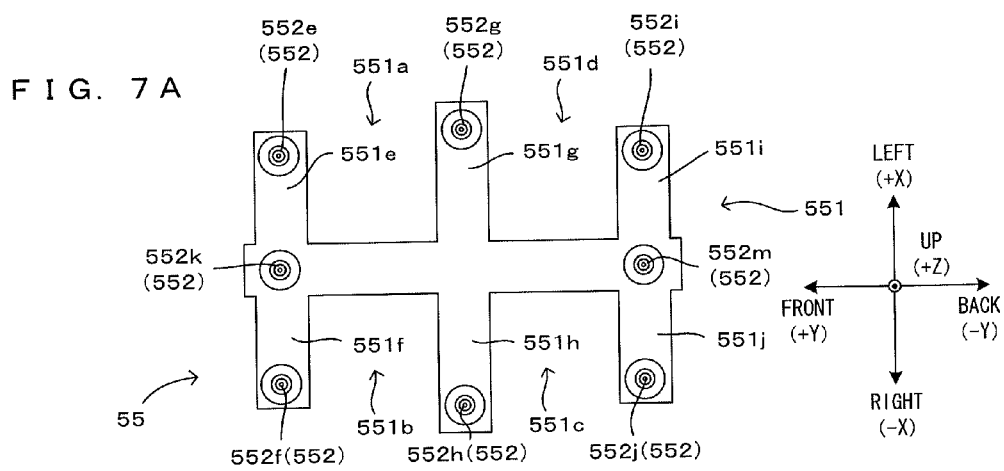
FIG. 7A is a plan view of the lift pin unit equipped in the lower stage unit.
Figure 7B:
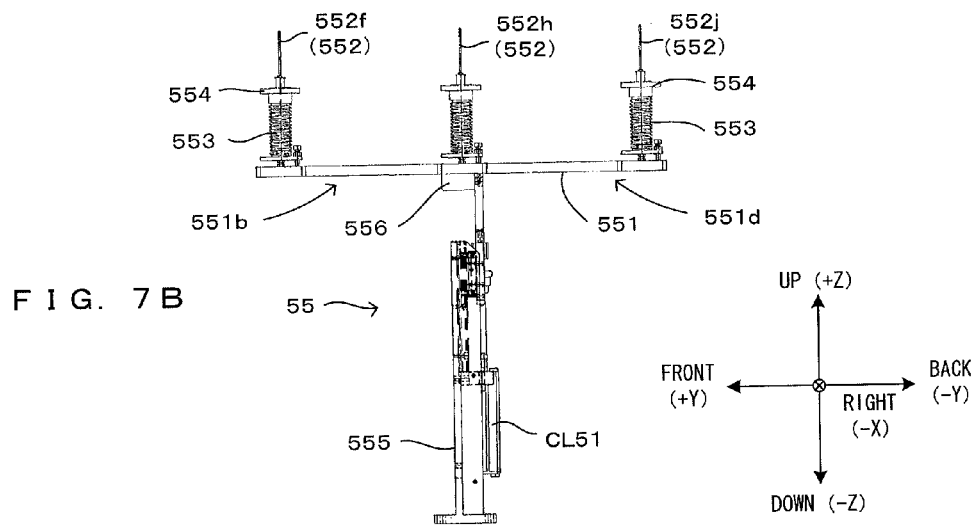
FIG. 7B is a side view of the lift pin unit shown in FIG. 7A.

FIG. 7A is a plan view of the lift pin unit equipped in the lower stage unit and FIG. 7B is a side view of the lift pin unit shown in FIG. 7A. In the lift pin unit 55, a lift plate 551 is provided movably upward and downward between the suction plate 51 and the stage base 54. The lift plate 551 is formed with cutouts 551a to 551d at four positions to prevent interference with the imaging units 45a to 45d. That is, in a state where the imaging units 45a to 45d are respectively fitted in the cutouts 551a to 551d, the lift plate 551 is movable upward and downward in the vertical direction Z. By providing the cutouts 551a to 551d at the four positions in this way, the lift plate 551 is formed with six finger parts 551e to 551j, and lift pins 552e to 552j respectively stand vertically upward from leading end portions of the respective finger parts 551e to 551j. Further, another lift pin 552k stands between the lift pins 552e and 552f, and still another lift pin 552m stands between the lift pins 552i and 552j. These eight lift pins 552 (552e to 552k, 552m) stand on the lift plate 551 and can support the entire lower surface of the blanket. These lift pins 552 are thinner than through holes (not shown) perforated in the vertical direction in the outer peripheral edge of the suction plate 51 and are insertable into the through holes from a vertically lower side as shown in FIG. 5.

A compression spring 553 and a housing 554 are fitted on each lift pin 552 in this order from above, and a lower end portion of the compression spring 553 is engaged with the lift plate 551 and an upper end portion thereof is covered by the housing 554. Note that the upper surface of the housing 554 has a circular shape having a larger outer diameter than an inner diameter of the through hole of the suction plate 51. When the lift plate 551 is moved upward by a pin elevating cylinder CL51 as described next, the upper surfaces of the housings 554 are engaged with the lower surface of the suction plate 51 and the compression springs 553 are sandwiched and compressed between these upper surfaces and the lift plate 551, whereby an upward moving speed of the lift plate 551 is controlled. Further, also when the lift plate 551 is moved downward, a downward moving speed of the lift plate 551 is controlled using compression forces of the compression springs 553.

The pin elevating cylinder CL51 is fixed to a side surface of a guide bracket 555 whose lower surface is fixed to the camera mount base 41, and a piston leading end thereof supports the lift plate 551 via a slide block 556. Accordingly, the pin elevating cylinder CL51 is actuated to move the lift plate 551 upward and downward by the valve control unit 64 of the control unit 6 switching the opening and closing of a valve connected to the pin elevating cylinder CL51. As a result, all the lift pins 552 are moved toward and away from the upper surface of the suction plate 51, i.e. the suction surface. For example, if the lift pins 552 projects in the (+Z) direction from the upper surface of the suction plate 51, the blanket can be placed on the tops of the lift pins 552 by the blanket conveyance robot. Following the placement of the blanket, the lift pins 552 are retracted in the (−Z direction) from the upper surface of the suction plate 51, whereby the blanket is transferred to the upper surface of the suction plate 51. Thereafter, the thickness of the blanket is measured by a blanket thickness measurement sensor SN51 arranged near the suction plate 51 at an appropriate timing as described later.

Figure 8:
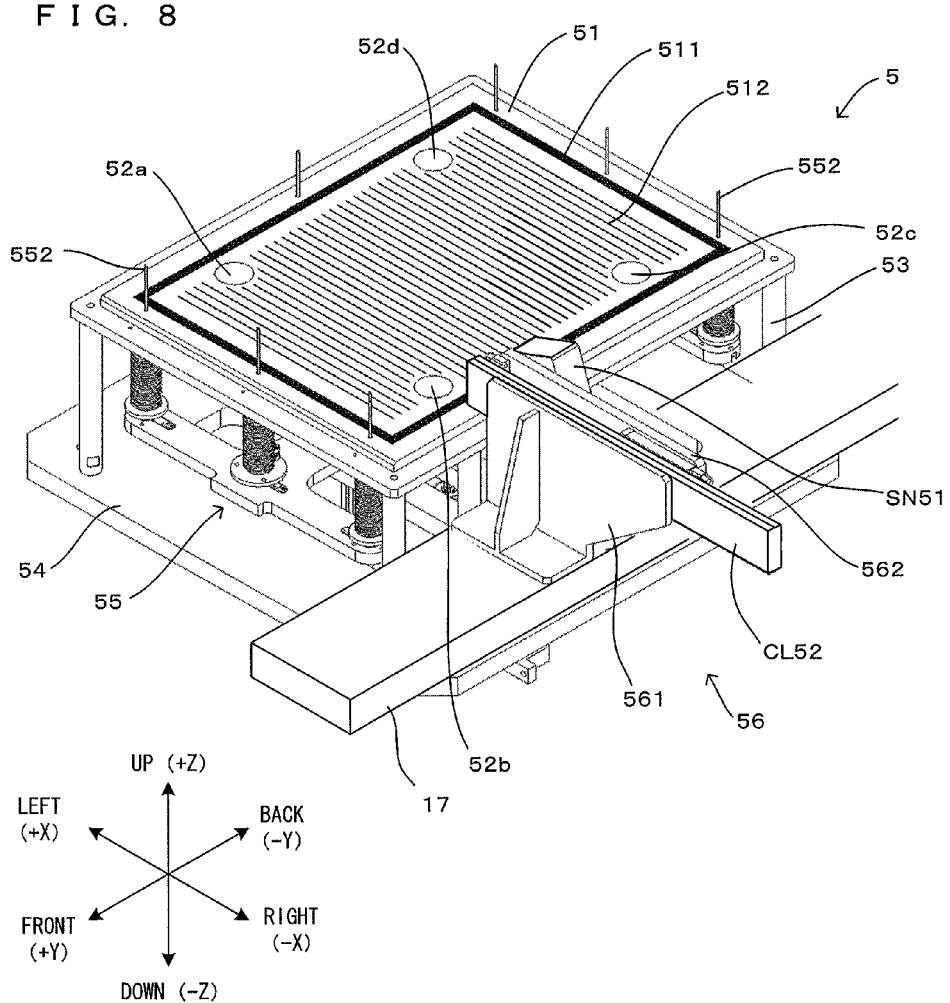
FIG. 8 is a perspective view showing a blanket thickness measurement unit.

FIG. 8 is a perspective view showing a blanket thickness measurement unit. A blanket thickness measurement unit 56 is a part of the lower stage unit 5 and configured as follows. In the blanket thickness measurement unit 56, a cylinder bracket 561 is fixed to the second frame structure at a position near the right side of the suction plate 51. A sensor horizontal drive cylinder CL52 is fixed in a horizontal posture to the cylinder bracket 561. A slide plate 562 mounted on the cylinder CL52 slides in the lateral direction X by the valve control unit 64 of the control unit 6 switching the opening and closing of a valve connected to the cylinder CL52. The blanket thickness measurement sensor SN51 is mounted on a left end portion of the slide plate 562. Thus, when the slide plate 562 is moved toward the left (+X) side, i.e. horizontally moved toward the suction plate 51 by the sensor horizontal drive cylinder CL52, the blanket thickness measurement sensor SN51 is positioned to a position right above a right end portion of the blanket sucked and held by the suction plate 51. The sensor SN51 is also configured similarly to the printing plate thickness measurement sensor SN22 and the substrate thickness measurement sensor SN23 and can measure the thickness of the blanket by the same measurement principle. On the other hand, at timings other than a measurement timing, the slide plate 562 is moved to the right (−X) side, i.e. moved to a retracted position distant from the suction plate 51 by the sensor horizontal drive cylinder CL52 to prevent the interference of the blanket thickness measurement unit 56.

B-5. Pressing Unit 7

Figure 9A:
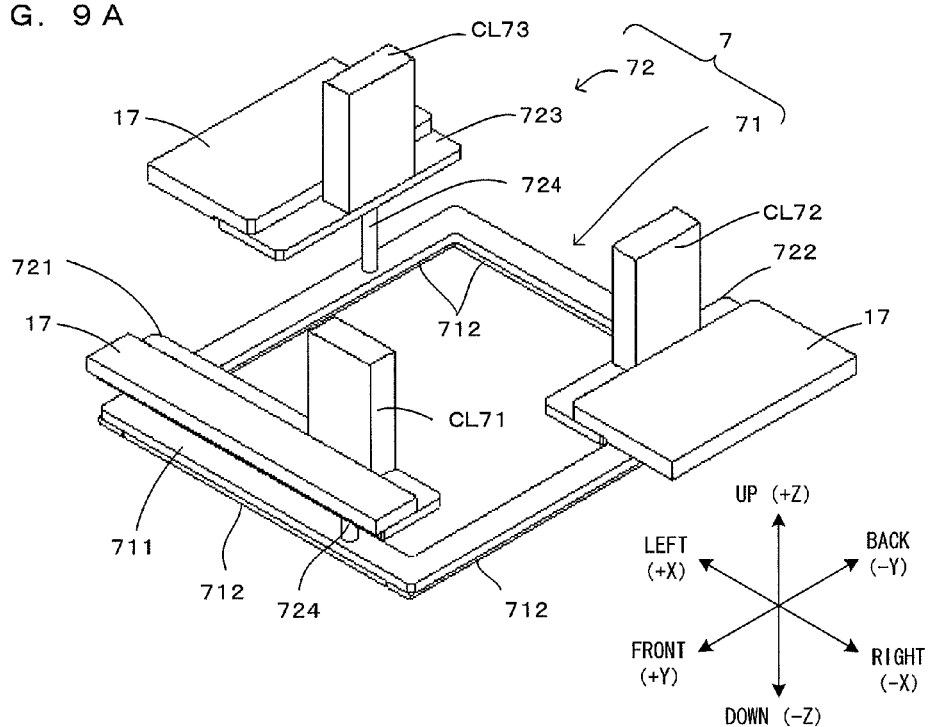
FIG. 9A is a perspective view showing the configuration of the pressing unit equipped in the printing apparatus of FIG. 1.
Figure 9B:
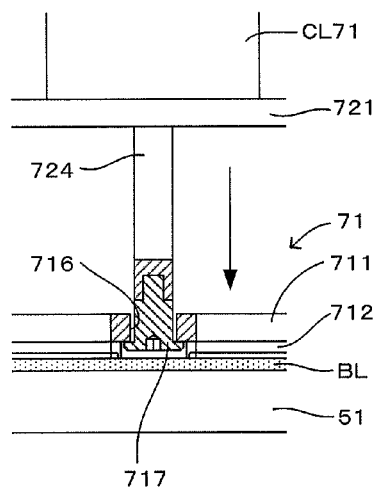
FIG. 9B is a view showing a state where the blanket sucked and held by the suction plate is pressed by the pressing unit.
Figure 9C:
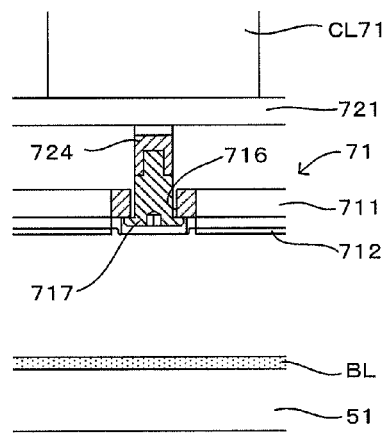
FIG. 9C is a view showing a state where the blanket is released from the pressing unit.

FIG. 9A is a perspective view showing the configuration of the pressing unit equipped in the printing apparatus of FIG. 1. FIG. 9B is a view showing a state where the blanket sucked and held by the suction plate is pressed by the pressing unit (hereinafter, referred to as a "blanket pressing state"). FIG. 9C is a view showing a state where the blanket is released from the pressing unit (hereinafter, referred to as a "blanket releasing state"). The pressing unit 7 is switched between the blanket pressing state and the blanket releasing state by moving a pressing member 71 provided vertically above the suction plate 51 upward and downward in the vertical direction Z by a switching mechanism 72.

In the switching mechanism 72, pressing member elevating cylinders CL71 to CL73 are so mounted on the horizontal plates 17 of the second frame structure by cylinder brackets 721 to 723 as to be able to move pistons 724 back and forth at vertically lower sides. The pressing member 71 is loosely fitted in a hanging state at leading end portions of these pistons 724.

The pressing member 71 includes a supporting plate 711 and four blanket pressing plates 712. The supporting plate 711 has the same planar size as the blanket BL and is in the form of a frame as a whole with an open central portion. The four blanket pressing plates 712 are fixed to the lower surface of the supporting plate 711 and cover the entire lower surface of the supporting plate 711.

As shown in FIGS. 9B and 9C, the supporting plate 711 is perforated with through holes 716 having an inner diameter larger than an outer diameter of the pistons 724 at positions corresponding to the pressing member elevating cylinders CL71 to CL73. Fastening members 717 are connected to the leading end portion of the pistons 724 through the through holes 716 from below the respective through holes 716. Accordingly, the pistons 724 of the pressing member elevating cylinders CL71 to CL73 are coupled to the pressing member elevating cylinders CL71 to CL73 in a state loosely fitted to the supporting plate 711. That is, the pressing member 71 is supported in a floating state relative to the pressing member elevating cylinders CL71 to CL73.

By the valve control unit 64 of the control unit 6 switching the opening and closing of valves connected to the pressing member elevating cylinders CL71 to CL73, the pressing member elevating cylinder CL71 to CL73 are actuated to bring the pressing member 71 into contact with or away from the suction plate 51 of the lower stage unit 5. For example, the pressing member 71 is lowered to press the suction plate 51 holding the blanket BL and sandwich and hold a peripheral edge portion of the blanket BL over the entire circumference together with the suction plate 51. Further, also when the suction plate 51 is moved for alignment, the pressing member 71 moves in the horizontal direction (X direction, Y direction) together with the suction plate 51 to stably hold the blanket BL.

B-6. Pre-Alignment Unit 8

Figure 10:
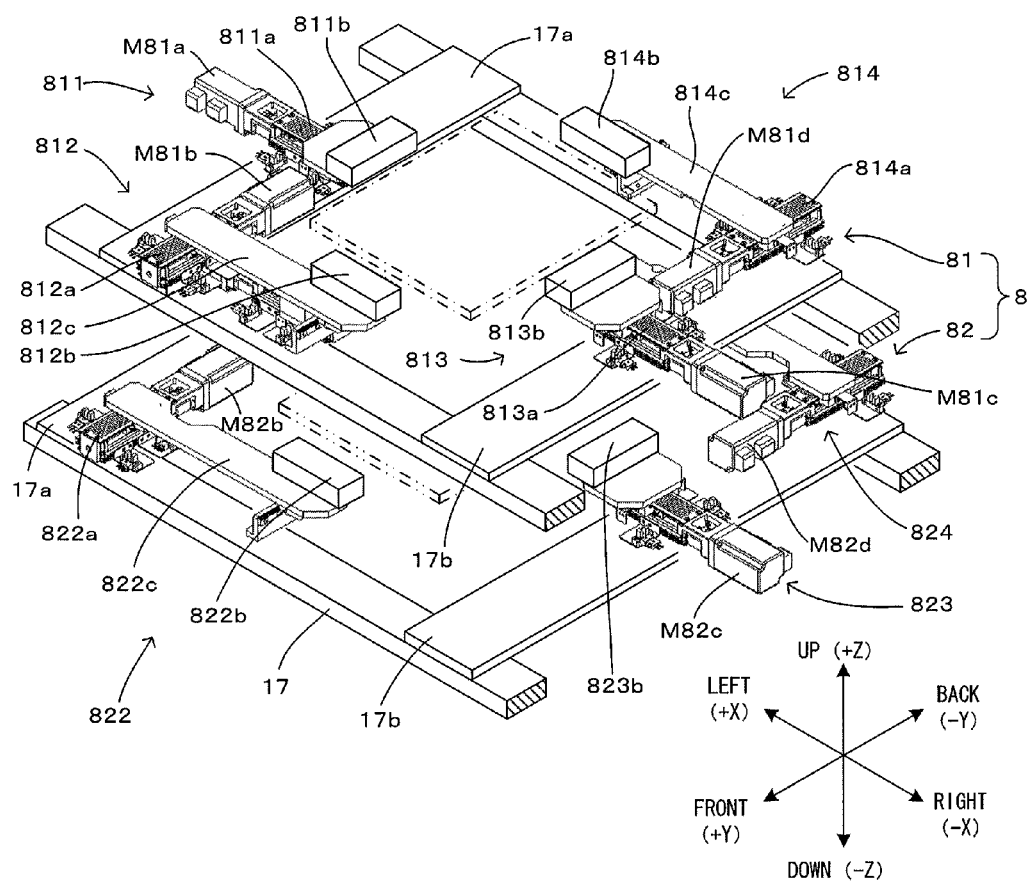
FIG. 10 is a perspective view showing the pre-alignment unit equipped in the printing apparatus of FIG. 1.

FIG. 10 is a perspective view showing the pre-alignment unit equipped in the printing apparatus of FIG. 1. The pre-alignment unit 8 includes a pre-alignment upper section 81 and a pre-alignment lower section 82. The pre-alignment upper section 81 is arranged vertically above the pre-alignment lower section 82 and aligns the printing plate PP held by the printing plate shuttle 25L and the substrate SB held by the substrate shuttle 25R at the position XP23 prior to close contact with the blanket BL. On the other hand, the pre-alignment lower section 82 aligns the blanket BL placed on the suction plate 51 of the lower stage unit 5 prior to close contact with the printing plate PP or the substrate SB. Note that the pre-alignment upper section 81 and the pre-alignment lower section 82 basically have the same configuration. Accordingly, the configuration of the pre-alignment upper section 81 is described below and that of the pre-alignment lower section 82 is denoted by the same or equivalent reference signs and not described.

The pre-alignment upper section 81 includes four upper guide movement parts 811 to 814. Each of the upper guide movement parts 811 to 814 is provided on the horizontal plates 17 that are arranged in the upper level within the second frame structure. That is, the upper guide movement part 811 is mounted on a central portion of the left horizontal plate 17a of the two horizontal plates extending in the front-back direction Y, and the upper guide movement part 812 is mounted on a front end portion thereof. The upper guide movement part 813 is mounted on a central portion of the other right horizontal plate 17b and the upper guide movement part 814 is mounted on a rear end portion thereof. Note that the upper guide movement parts 811, 813 have the same configuration and the upper guide movement parts 812, 814 have the same configuration. Thus, the configurations of the upper guide movement parts 811, 813 are described below and those of the upper guide movement parts 812, 814 are denoted by the same or equivalent reference signs and not described.

In the upper guide movement part 811, a ball screw mechanism 811a is fixed to the central portion of the left horizontal plate 17a while extending in the lateral direction X. A ball screw bracket is threadably engaged with a ball screw of the ball screw mechanism 811a, and an upper guide 811b is mounted on the ball screw bracket to face the upper guide movement part 813. A rotary shaft (not shown) of an upper guide drive motor M81a is coupled to a left end portion of the ball screw mechanism 811a, and the upper guide 811b moves in the lateral direction X by actuating the upper guide drive motor M81a in response to an operation command from the motor control unit 63 of the control unit 6.

In the upper guide movement part 812, a ball screw mechanism 812a is fixed to the front end portion of the left horizontal plate 17a while extending in the front-back direction Y. A ball screw bracket is threadably engaged with a ball screw of the ball screw mechanism 812a, and a left end portion of a guide holder 812c extending in the lateral direction is fixed to the ball screw bracket. A right end portion of the guide holder 812c reaches a middle position between the horizontal plates 17a, 17b and an upper guide 812b is mounted on a right end portion thereof to face the upper guide movement part 814. Further, a rotary shaft (not shown) of an upper guide drive motor M81b is coupled to a rear end portion of the ball screw mechanism 812a, and the upper guide 812b moves in the front-back direction Y by actuating the upper guide drive motor M81b in response to an operation command from the motor control unit 63 of the control unit 6.

In this way, the four upper guides 811b to 814b surround the printing plate PP or the substrate SB (dashed-dotted line in FIG. 10) at the position vertically below the position XP23 and the respective upper guides 811b to 814b are independently movable toward and away from the printing plate PP or the like. Thus, by controlling movement amounts of the respective upper guides 811b to 814b, the printing plate PP and the substrate SB can be aligned by being horizontally moved or rotated on the hands of the shuttles.

B-7. Static Eliminator 9

Figure 11:
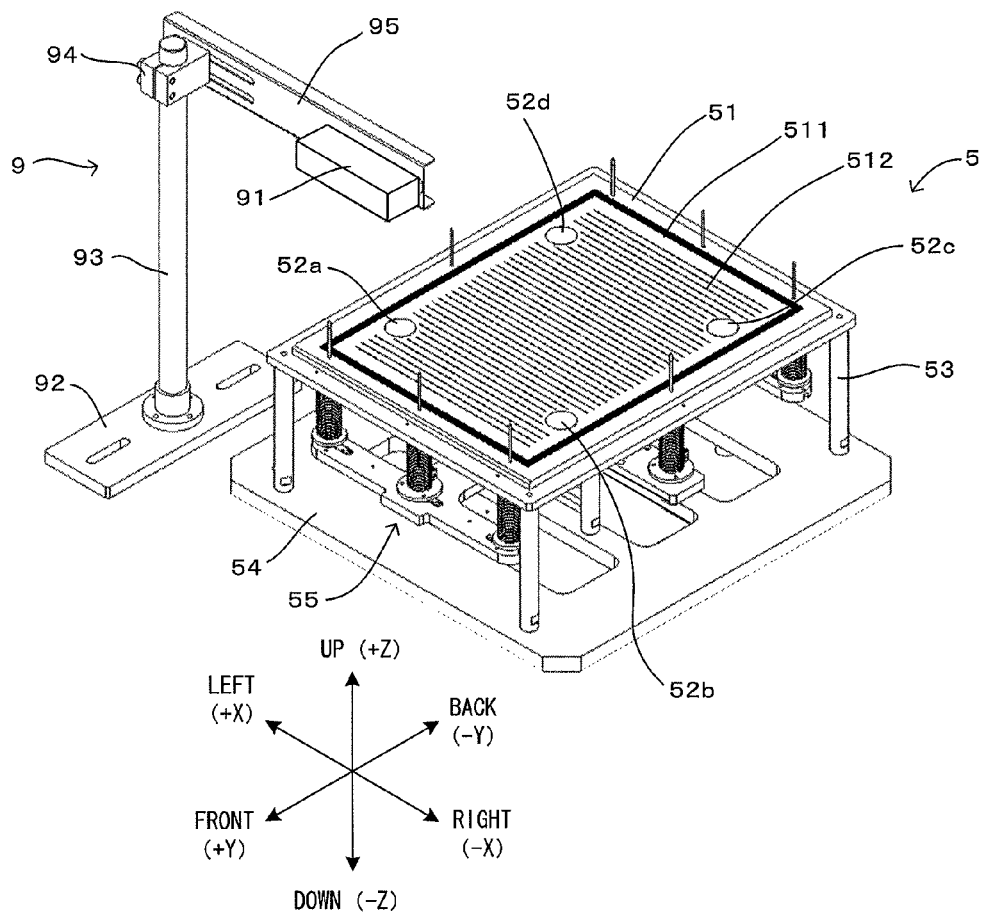
FIG. 11 is a perspective view showing the static eliminator equipped in the printing apparatus of FIG. 1.

FIG. 11 is a perspective view showing the static eliminator equipped in the printing apparatus of FIG. 1. In the static eliminator 9, a base plate 92 is fixed to the upper surface of the stone plate 13 at the left side of the lower stage unit 5. A column member 93 stands from the base plate 92 and an upper end portion thereof is located at a higher position than the lower stage unit 5. An ionizer bracket 95 is mounted on an upper end part of the column member 93 via a fixture 94. The ionizer bracket 95 extends in the rightward (−X) direction and a leading end portion thereof reaches the vicinity of the suction plate 51. The ionizer 91 is mounted on that leading end portion.

B-8. Control Unit 6

The control unit 6 includes a CPU (Central Processing Unit) 61, a memory 62, the motor control unit 63, the valve control unit 64, the image processing unit 65 and a display/operation unit 66. The CPU 61 controls the respective components of the apparatus in accordance with a program stored in the memory 62 in advance and performs a patterning process and a transfer process as shown in FIGS. 12 to 19.

C. Overall Operation of Printing Apparatus

Figure 12:
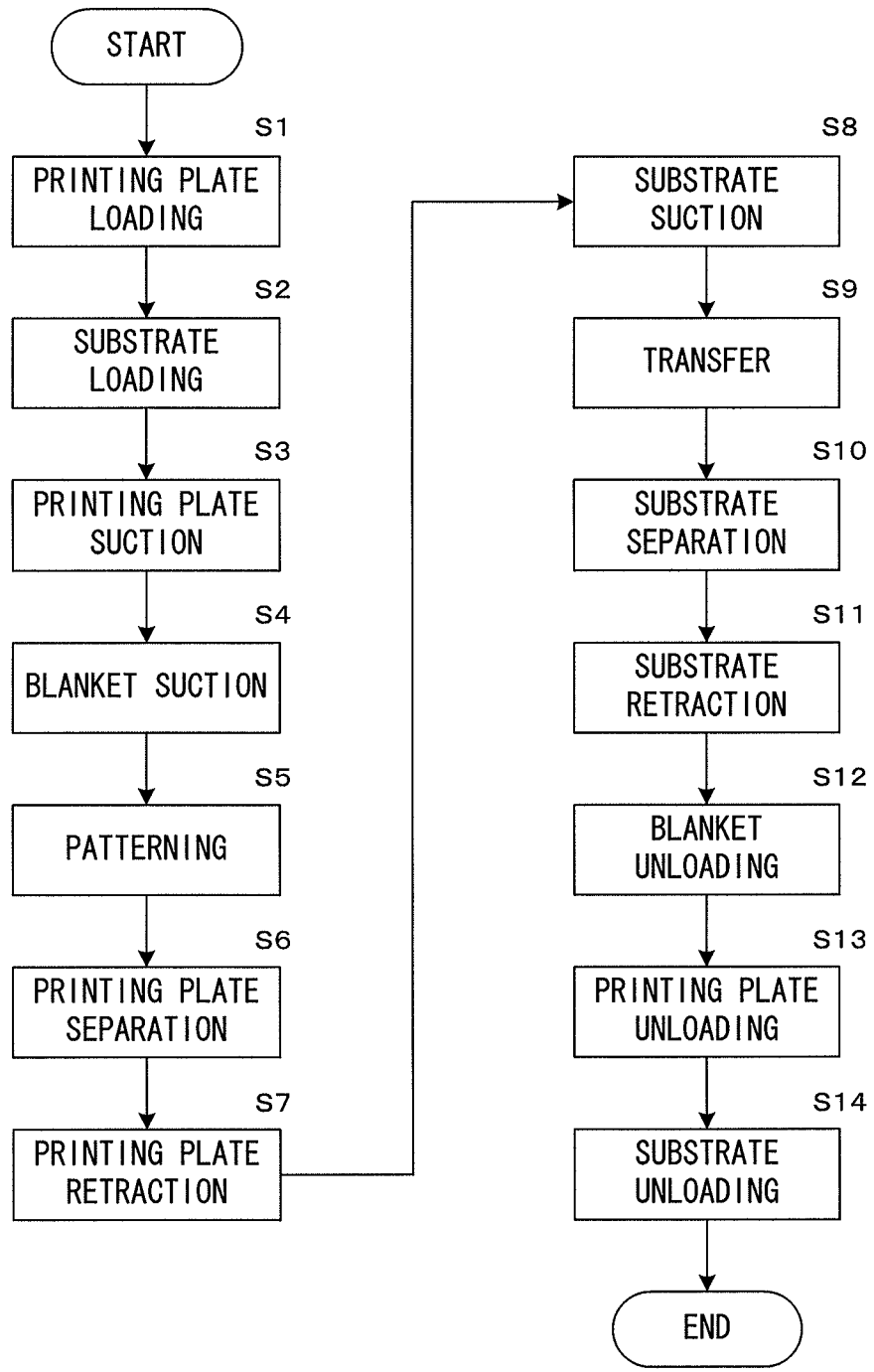
FIG. 12 is a flow chart showing the overall operation of the printing apparatus of FIG. 1.

FIG. 12 is a flow chart showing the overall operation of the printing apparatus of FIG. 1. FIGS. 13 to 19 are charts showing the operation of the printing apparatus of FIG. 1, wherein a table in each figure shows control contents (control targets and operation contents) by the control unit 6 and diagrams in each figure show states of the respective components of the apparatus. In an initial state of the printing apparatus 100, as shown in a field (a) of FIG. 13, the printing plate shuttle 25L and the substrate shuttle 25R are respectively positioned at the middle positions XP22, XP24. After the printing plate PP is set on the printing plate loading/unloading unit, the printing plate shuttle 25L performs a printing plate loading step (Step S1). After the substrate SB is set on the substrate loading/unloading unit, the substrate shuttle 25R performs a substrate loading step (Step S2). Note that the substrate SB is loaded (Step S2) after the printing plate PP is loaded (Step S1) since a conveyance structure of integrally moving the printing plate shuttle 25L and the substrate shuttle 25R in the lateral direction is adopted. As a matter of course, the order of the both may be reversed.

C-1. Printing Plate Loading Step (Step S1)

Figure 13:
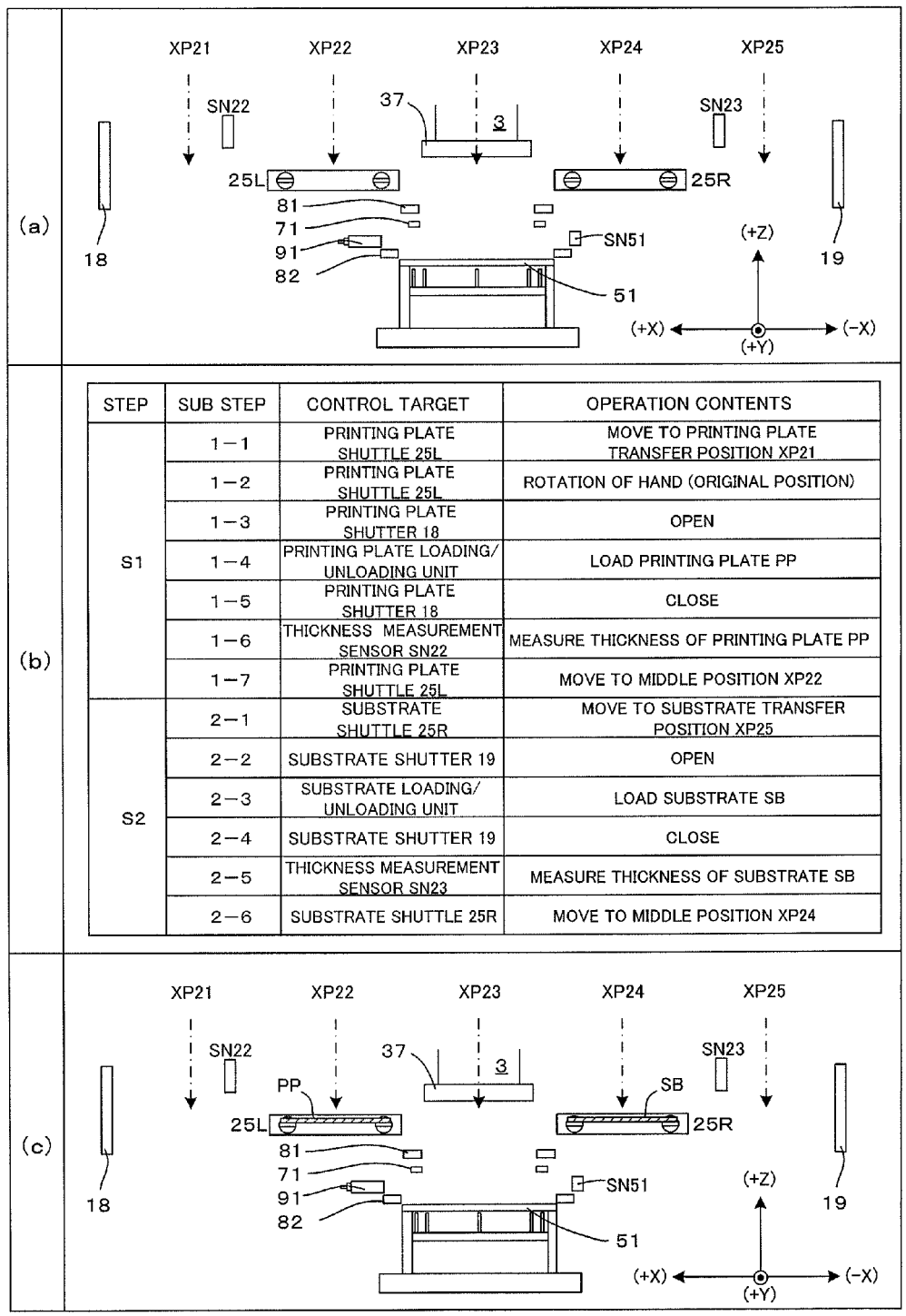

As shown in "Step S1" in a field (b) of FIG. 13, Substeps (1-1) to (1-7) are performed. That is, the shuttle horizontal drive motor M21 rotates its rotary shaft in a predetermined direction to move the shuttle holding plate 24 in the (+X) direction (1-1). Thus, the printing plate shuttle 25L is moved and positioned to the printing plate transfer position XP21. Further, the rotary actuators RA2, RA2 operate to rotate the printing plate hands 252, 252 by 180 degrees and position them at original positions (1-2). Therefore, the hand posture is switched from the used posture to the unused posture, whereby preparation for loading the printing plate PP before use is completed.

Then, the printing plate shutter drive cylinder CL11 operates to move the printing plate shutter 18 vertically downward, i.e. to open the shutter 18 (1-3). Subsequently, the printing plate loading/unloading unit loads the printing plate PP into the printing apparatus 100 in response to an operation command from the control unit 6 and places it on the hands 252, 252 of the printing plate shuttle 25L (1-4). When the loading of the printing plate PP is completed in this way, the opening/closing state of the above valve is returned to the original one and the printing plate shutter drive cylinder CL11 operates in the opposite direction to return the printing plate shutter 18 to the original position, i.e. to close the shutter 18 (1-5).

When the loading of the printing plate PP is completed, the printing plate PP is located at the printing plate transfer position XP21. Accordingly, at this timing, the printing plate thickness measurement sensor SN22 operates to detect the height positions (positions in the vertical direction Z) of the upper and lower surfaces of the printing plate PP, and outputs height information indicating these detection results to the control unit 6. Based on these pieces of height information, the CPU 61 calculates the thickness of the printing plate PP and stores it in the memory 62. In this way, the thickness of the printing plate PP is measured (1-6). Thereafter, the shuttle horizontal drive motor M21 rotates its rotary shaft in the opposite direction to move the shuttle holding plate 24 in the (−X) direction and position it to the middle position XP22 (1-7).

C-2. Substrate Loading Step (Step S2)

As shown in "Step S2" in the field (b) of FIG. 13, Substeps (2-1) to (2-6) are performed. That is, the shuttle horizontal drive motor M21 rotates its rotary shaft in the direction opposite to the predetermined direction to move the shuttle holding plate 24 in the (−X) direction (2-1). The substrate shuttle 25R is moved and positioned to the substrate transfer position XP25. Note that no rotation mechanism is provided for the substrate hands 252, 252 and preparation for the loading of the substrate SB is completed when Substep (2-1) is completed.

Then, the substrate shutter drive cylinder CL12 operates to move the substrate shutter 19 vertically downward, i.e. to open the shutter 19 (2-2). Following this, the substrate loading/unloading unit loads the substrate SB into the printing apparatus 100 in response to an operation command from the control unit 6 to place the substrate SB on the hands 252, 252 of the substrate shuttle 25R (2-3). When the loading of the substrate SB is completed, the substrate shutter drive cylinder CL12 operates in an opposite direction by returning the opening/closing state of the above valve to the original one, thereby returning the substrate shutter 19 to the original position, i.e. to close the shutter 19 (2-4).

When the loading of the substrate SB is completed, the substrate SB is located at the substrate transfer position XP25. Accordingly, at this timing, the substrate thickness measurement sensor SN23 is actuated to detect the height positions (positions in the vertical direction Z) of the upper and lower surfaces of the substrate SB, and outputs height information indicating these detection results to the control unit 6. Based on these pieces of height information, the CPU 61 calculates the thickness of the substrate SB and stores it in the memory 62. Thus, the thickness of the substrate SB is measured (2-5). Thereafter, the shuttle horizontal drive motor M21 rotates its rotary shaft in the predetermined direction to move the shuttle holding plate 24 in the (+X) direction and position it to the middle position XP24 (2-6).

As just described, in this embodiment, not only the printing plate PP, but also the substrate SB is prepared before the patterning process as shown in a field (c) of FIG. 13. Thereafter, the patterning process and the transfer process are successively performed as described in detail later. Accordingly, a time interval until an application layer patterned on the blanket BL is transferred to the substrate SB can be shortened and stable processes are performed.

C-3. Printing Plate Suction (Step S3).

As shown in "Step S3" in a field (a) of FIG. 14, Substeps (3-1) to (3-7) are performed. That is, the shuttle horizontal drive motor M21 rotates its rotary shaft to move the shuttle holding plate 24 in the (−X) direction (3-1). The printing plate shuttle 25L is moved and positioned to the printing plate suction position XP23. Then, the printing plate shuttle elevating motor M22L rotates its rotary shaft to move the elevating plate 251 in the downward (−Z) direction (3-2). The printing plate PP supported on the printing plate shuttle 25L is moved and positioned to a pre-alignment position lower than the conveyance position.

Subsequently, the upper guide drive motors M81a to M81d rotate their rotary shafts to move the upper guides 811b, 813b in the lateral direction X and move the upper guides 812b, 814b in the front-back direction Y. This causes the respective upper guides 811b to 814b to come into contact with end surfaces of the printing plate PP supported on the printing plate shuttle 25L, thereby positioning the printing plate PP to a horizontal position set in advance. Thereafter, the respective upper guide drive motors M81a to M81d rotate their rotary shafts in an opposite direction and the respective upper guides 811b to 814b are separated from the printing plate PP (3-3).

When the pre-alignment process for the printing plate PP is completed, the stage elevating motor M31 rotates its rotary shaft in a predetermined direction to lower the suction plate 37 in the downward (−Z) direction and bring it into contact with the upper surface of the printing plate PP. Following this, the valves V31, V32 are opened, whereby the printing plate PP is sucked to the suction plate 37 by the suction grooves 371 and the suction pads 38 (3-4).

When the suction of the printing plate PP is detected by a suction detection sensor SN31 (FIG. 2), the stage elevating motor M31 rotates its rotary shaft in an opposite direction and the suction plate 37 moves vertically upward while sucking and holding the printing plate PP. This makes the printing plate PP move to a position vertically above the printing plate suction position XP23 (3-5). Then, the printing plate shuttle elevating motor M22L rotates its rotary shaft to move the elevating plate 251 vertically upward, thereby moving the printing plate shuttle 25L from the pre-alignment position to the conveyance position, i.e. to the printing plate suction position XP23 (3-6). Thereafter, the shuttle horizontal drive motor M21 rotates its rotary shaft to move the shuttle holding plate 24 in the (+X) direction and the emptied printing plate shuttle 25L is positioned to the middle position XP22 (3-7).

C-4. Blanket Suction (Step S4)

As shown in "Step S4" in the field (a) of FIG. 14, Substeps (4-1) to (4-9) are performed. That is, the X-axis drive motors M42, M44 and the Y-axis drive motors M41, M43 are actuated to move the alignment stage 44 to an initial position (4-1). Accordingly, the alignment stage 44 is started from the same position every time. Following this, the pin elevating cylinder CL51 operates to lift the lift plate 551 and cause the lift pins 552 to project vertically upward form the upper surface of the suction plate 51 (4-2). When preparation for the loading of the blanket BL is completed in this way, the blanket shutter drive cylinder CL13 operates to move the blanket shutter (not shown) and open the shutter (4-3). The blanket conveyance robot accesses to the apparatus 100 and then places the blanket BL on the tops of the lift pins 552. Thereafter, the blanket conveyance robot is retracted from the apparatus 100 (4-4). Following this, the blanket shutter drive cylinder CL13 operates to move the blanket shutter and close the shutter (4-5).

Subsequently, the pin elevating cylinder CL51 operates to lower the lift plate 551, whereby the lift pins 552 are lowered while supporting the blanket BL and places the blanket BL on the suction plate 51 (4-6). Then, the lower guide drive motors M82a to M82d rotate their rotary shafts to move the lower guides 821b, 823b in the lateral direction X and move the lower guides 822b, 824b in the front-back direction Y. Hence, the respective lower guides 821b to 824b come into contact with end surfaces of the blanket BL supported on the suction plate 51 and position the blanket BL to a horizontal position set in advance (4-7).

When the pre-alignment process for the blanket BL is completed, the suction valves V52 are opened, whereby the adjusted negative pressure is supplied to the grooves 511, 512 and the blanket BL is sucked to the suction plate 51 (4-8). Further, the respective lower guide drive motors M82a to M82d rotate their rotary shafts in an opposite direction to separate the respective lower guides 821b to 824b from the blanket BL (4-9). Thus preparation for the patterning process is completed as shown in a field (b) of FIG. 14.

C-5. Patterning (Step S5)

Here, the patterning is performed after the blanket thickness is measured. That is, as shown in "Step S5" in a field (a) of FIG. 15, the sensor horizontal drive cylinder CL52 operates to position the blanket thickness measurement sensor SN51 to a position right above a right end portion of the blanket BL (5-1). Then, the blanket thickness measurement sensor SN51 outputs information on the thickness of the blanket BL to the control unit 6, whereby the thickness of the blanket BL is measured (5-2). Thereafter, the sensor horizontal drive cylinder CL52 operates in an opposite direction to slide the slide plate 562 in the (−X) direction and retract the blanket thickness measurement sensor SN51 from the suction plate 51 (5-3).

Subsequently, the first stage elevating motor M31 rotates its rotary shaft in a predetermined direction to lower the suction plate 37 in the downward (−Z) direction and move the printing plate PP to the vicinity of the blanket BL. Further, the second stage elevating motor M32 rotates its rotary shaft, thereby moving the suction plate 37 upward and downward at a narrow pitch to accurately adjust a distance between the printing plate PP and the blanket BL in the vertical direction Z, i.e. the gap amount (5-4). Note that the gap amount is determined by the control unit 6 based on the thickness measurement results of the printing plate PP and the blanket BL.

Then, the pressing member elevating cylinders CL71 to CL73 operate to lower the pressing member 71 and press the peripheral edge portion of the blanket BL over the entire circumference by the pressing member 71 (5-5). Following this, the valves V51, V52 are operated to partly supply air between the suction plate 51 and the blanket BL and partly raise the blanket BL. The lifted portion of the blanket BL is pressed against the printing plate PP held by the upper stage unit 3 (5-6). As a result, as shown in a field (b) of FIG. 15, a central portion of the blanket BL comes into close contact with the printing plate PP. A pattern (not shown) formed in advance on the lower surface of the printing plate PP comes into contact with the application layer applied to the upper surface of the blanket BL in advance, thereby patterning the application layer. Accordingly, a pattern layer is formed on the upper surface of the blanket BL.

C-6. Printing Plate Separation (Step S6)

Figure 15:
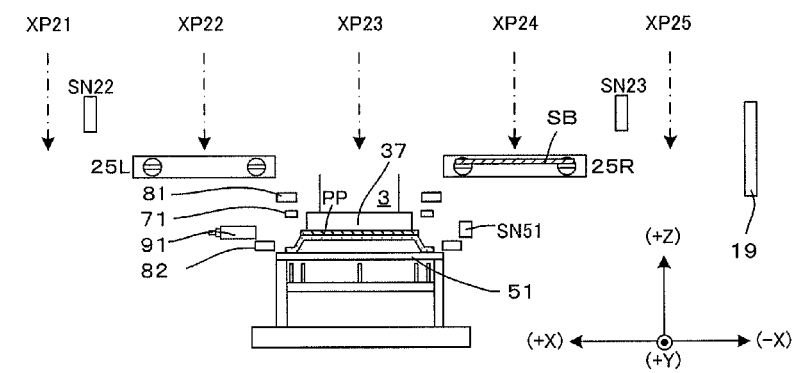

As shown in "Step S6" in a field (c) of FIG. 15, Substeps (6-1) to (6-5) are performed. That is, the second stage elevating motor M32 rotates its rotary shaft to lift the suction plate 37 and separate the printing plate PP from the blanket BL (6-1). Further, in parallel with the lifting of the printing plate PP for the separation process, the opening/closing states of the valves V51, V52 are switched at an appropriate timing and a negative pressure is applied to the blanket BL to pull the blanket BL toward the suction plate 37. Thereafter, the first stage elevating motor M31 rotates its rotary shaft to lift the suction plate 37 and position the printing plate PP to a static elimination position substantially at the same height as the ionizer 91 (6-2). Further, the pressing member elevating cylinders CL71 to CL73 operate to lift the pressing member 71 and release the blanket BL from the pressed state (6-3). Following this, the ionizer 91 is actuated to eliminate static electricity generated at the time of the printing plate separation process (6-4). When the static elimination process is completed, the first stage elevating motor M31 rotates its rotary shaft, whereby the suction plate 37 is lifted to the original position (position higher than the printing plate suction position XP23) while sucking and holding the printing plate PP as shown in a field (d) of FIG. 15 (6-5).

C-7. Printing Plate Retraction (Step S7)

As shown in "Step S7" in a field (a) of FIG. 16, Substeps (7-1) to (7-7) are performed. That is, the rotary actuators RA2, RA2 operate to rotate the printing plate hands 252, 252 by 180 degrees and position them from the original positions to inverted positions (7-1). The hand posture is switched from the unused posture to the used posture and preparation for receiving the used printing plate PP is completed. Then, the shuttle horizontal drive motor M21 rotates its rotary shaft to move the shuttle holding plate 24 in the (−X) direction (7-2), whereby the printing plate shuttle 25L is moved and positioned to the printing plate suction position XP23.

On the other hand, the first stage elevating motor M31 rotates its rotary shaft and the suction plate 37 is lowered toward the hands 252, 252 of the printing plate shuttle 25L and positions the printing plate PP on the hands 252, 252 while sucking and holding the printing plate PP. Thereafter, the valves V31, V32 are closed, so that the suction of the printing plate PP by the suction grooves 371 and the suction pads 38 is released. Hereby the transfer of the printing plate PP at the conveyance position is completed (7-3). Then, the first stage elevating motor M31 rotates its rotary shaft in the opposite direction to lift the suction plate 37 to the initial position (7-4). Thereafter, the shuttle horizontal drive motor M21 rotates its rotary shaft to move the shuttle holding plate 24 in the (+X) direction (7-5). The printing plate shuttle 25L is moved and positioned to the middle position XP22 while holding the used printing plate PP.

C-8. Substrate Suction (Step S8)

As shown in "Step S8" in the field (a) of FIG. 16, the shuttle horizontal drive motor M21 rotates its rotary shaft in the predetermined direction to move the shuttle holding plate 24 in the (+X) direction (8-1). The substrate shuttle 25R holding the substrate SB before processes is moved and positioned to the substrate suction position XP23. Then, as in the pre-alignment process for the printing plate PP (3-2, 3-3) and the suction process for the printing plate PP by the suction plate 37 (3-4), a pre-alignment process for the substrate SB (8-2, 8-3) and a suction process for the substrate SB (8-4) are performed.

Thereafter, when the suction of the substrate SB is detected by the suction detection sensor SN31 (FIG. 2), the stage elevating motor M31 rotates its rotary shaft and the suction plate 37 is moved vertically upward while sucking and holding the substrate SB. This makes the substrate SB move to a position higher than the substrate suction position XP23 (8-5). Then, the substrate shuttle elevating motor M22R rotates its rotary shaft to move the elevating plate 251 vertically upward, thereby moving the substrate shuttle 25R from the pre-alignment position to the conveyance position (8-6). Thereafter, the shuttle horizontal drive motor M21 rotates its rotary shaft to move the shuttle holding plate 24 in the (−X) direction and the emptied substrate shuttle 25R is positioned to the middle position XP24 (8-7).

C-9. Transfer (Step S9)

As shown in "Step S9" in a field (a) of FIG. 17, the blanket thickness is measured, precise alignment is performed and the transfer process is performed. That is, as shown in "Step S9" in the field (a) of FIG. 17, the thickness of the blanket BL is measured (9-1 to 9-3) as in Substeps (5-1 to 5-3) of the patterning process (Step S5). Note that the thickness of the blanket BL is measured not only immediately before the patterning, but also immediately before the transfer. The reason is that the thickness of the blanket BL changes with time since the blanket BL is partly swelled, and a highly accurate transfer process can be performed by measuring the thickness of the blanket immediately before the transfer.

Subsequently, the first stage elevating motor M31 rotates its rotary shaft in the predetermined direction to lower the suction plate 37 in the downward (−Z) direction and move the substrate SB to the vicinity of the blanket BL. Further, the second stage elevating motor M32 rotates its rotary shaft, thereby moving the suction plate 37 upward and downward at a narrow pitch to accurately adjust a distance between the substrate SB and the blanket BL in the vertical direction Z, i.e. the gap amount (9-4). The gap amount is determined by the control unit 6 based on the thickness measurement results of the substrate SB and the blanket BL. In the subsequent Sub-step (9-5), the peripheral edge portion of the blanket BL is pressed by the pressing member 71 as in the patterning (Step S5).

The substrate SB and the blanket BL are both pre-aligned and positioned while being spaced apart by a distance suitable for the transfer process. To accurately transfer the pattern layer formed on the blanket BL to the substrate SB, the both need to be precisely positioned. Therefore, Substeps (9-6 to 9-8) are performed (precise alignment).

Here, the Z-axis drive motors M45a to M45d of the alignment unit 4 are actuated to perform a focus adjustment in the respective imaging units 45a to 45d so that the alignment marks patterned on the blanket BL are focused (9-6). Then, images imaged by the respective imaging units 45a to 45d are output to the image processing unit 65 of the control unit 6 (9-7). Then, based on these images, the control unit 6 calculates a control amount used to position the blanket BL with respect to the substrate SB and generates operation commands for the X-axis drive motors M42, M44 and the Y-axis drive motors M41, M43 of the alignment unit 4. Then, the X-axis drive motors M42, M44 and the Y-axis drive motors M41, M43 are actuated in response to the control commands to horizontally move the suction plate 51 and rotate it about a virtual axis of rotation extending in the vertical direction Z, thereby precisely positioning the blanket BL with respect to the substrate SB (9-8).

Then, the valves V51, V52 are operated to partly supply air between the suction plate 51 and the blanket BL and partly raise the blanket BL. The lifted portion of the blanket BL is pressed against the substrate SB held by the upper stage unit 3 (9-9). As a result, as shown in a field (b) of FIG. 17, the blanket BL is held in close contact with the substrate SB. Accordingly, the pattern layer on the blanket BL is transferred to the substrate SB while precisely positioned with respect to the pattern on the lower surface of the substrate SB.

C-10. Substrate Separation (Step S10)

As shown in "Step S10 in a field (a) of FIG. 18, Substeps (10-1) to (10-5) are performed. That is, similar to the printing plate separation (Step S6), the separation of the substrate SB from the blanket BL (10-1), the positioning of the substrate SB to the static elimination position (10-2), the release of the blanket BL from the pressed state by the pressing member 71 (10-3) and static elimination (10-4) are performed. Thereafter, the first stage elevating motor M31 rotates its rotary shaft and the suction plate 37 is lifted to the initial position (position higher than the conveyance position) while sucking and holding the substrate SB (10-5) as shown in a field (b) of FIG. 18.

C-11. Substrate Retraction (Step S11).

As shown in "Step S11" in a field (a) of FIG. 19, Substeps (11-1) to (11-4) are performed. That is, the shuttle horizontal drive motor M21 rotates its rotary shaft to move the shuttle holding plate 24 in the (+X) direction (11-1), whereby the substrate shuttle 25R is moved and positioned to the substrate suction position XP23.

On the other hand, the first stage elevating motor M31 rotates its rotary shaft and the suction plate 37 is lowered toward the hands 252, 252 of the substrate shuttle 25R while sucking and holding the substrate SB. Thereafter, the valves V31, V32 are closed, whereby the suction of the substrate SB by the suction grooves 371 and the suction pads 38 is released (11-2). Then, the first stage elevating motor M31 rotates its rotary shaft in the opposite direction to lift the suction plate 37 to the initial position (11-3). Thereafter, the shuttle horizontal drive motor M21 rotates its rotary shaft to move the shuttle holding plate 24 in the (−X) direction and the substrate shuttle 25R is moved and positioned to the middle position XP24 while holding the substrate SB (11-4).

C-12. Blanket Unloading (Step S12)

As shown in "Step S12" in the field (a) of FIG. 19, Substeps (12-1) to (12-6) are performed. That is, the valves V51, V52 are operated to release the suction of the blanket BL by the suction plate 51 (12-1). Then, the pin elevating cylinder CL51 operate to lift the lift plate 551, thereby lifting the used blanket BL vertically upward from the suction plate 51 (12-2). Subsequently, the blanket shutter drive cylinder CL13 operates to move the blanket shutter (not shown) and open the shutter (12-3). Then, the blanket conveyance robot accesses to the apparatus 100, receives the used blanket BL from the tops of the lift pins 552 and retracts from the apparatus 100 (12-4). Following this, the blanket shutter drive cylinder CL13 operates to move the blanket shutter and close the shutter (12-5). Further, the pin elevating cylinder CL51 operates to lower the lift plate 551 and lower the lift pins 552 to below the suction plate 51 in the downward (−Z) direction (12-6).

C-13. Printing Plate Unloading Step (S13)

As shown in "Step S13" in the field (a) of FIG. 19, Substeps (13-1) to (13-5) are performed. That is, the shuttle horizontal drive motor M21 rotates its rotary shaft to move the shuttle holding plate 24 in the (+X) direction (13-1), whereby the printing plate shuttle 25L is moved and positioned to the printing plate transfer position XP21. Further, the printing plate shuttle drive cylinder CL11 operates to open the shutter 18 (13-2). Following this, the printing plate loading/unloading unit takes out the used printing plate PP from the printing apparatus 100 in response to an operation command from the control unit 6 (13-3). When the unloading of the printing plate PP is completed, the printing plate shutter drive cylinder CL11 operates in the opposite direction by returning the opening/closing states of the above valves to the original states, thereby returning the printing plate shutter 18 to the original position and closing the shutter 18 (13-4). Then, the shuttle horizontal drive motor M21 rotates its rotary shaft to move the shuttle holding plate 24 in the (−X) direction and position the printing plate shuttle 25L to the middle position XP22 (13-5).

C-14. Substrate Unloading (Step S14)

As shown in "Step S14" in the field (a) of FIG. 19, Substeps (14-1) to (14-5) are performed. That is, the shuttle horizontal drive motor M21 rotates its rotary shaft to move the shuttle holding plate 24 in the (−X) direction (14-1), whereby the substrate shuttle 25R is moved and positioned to the substrate transfer position XP25. Further, the substrate shutter drive cylinder CL12 operates to open the shutter 19 (14-2). Following this, the substrate loading/unloading unit takes out the substrate SB subjected to the transfer process from the printing apparatus 100 in response to an operation command from the control unit 6 (14-3). When the unloading of the substrate SB is completed, the substrate shutter drive cylinder CL12 operates in the opposite direction to return the substrate shutter 19 to the original position and close the shutter 19 (14-4). Then, the shuttle horizontal drive motor M21 rotates its rotary shaft to move the shuttle holding plate 24 in the (+X) direction and position the substrate shuttle 25R to the middle position XP24 (14-5). Accordingly, the printing apparatus 100 returns to the initial state as shown in a field (b) of FIG. 19.

D. Pattern Forming Technology

The above printing apparatus uses the blanket BL as a plate-like bearing member for bearing the application layer and the pattern layer. The suction plate 37 of the upper stage unit 3 holds the printing plate PP and the suction plate 51 of the lower stage unit 5 sucks and holds the blanket BL with the application layer carried on the blanket BL and the printing plate PP facing each other. As shown in the field (b) of FIG. 15, the blanket BL is lifted toward the printing plate PP to come into contact with the printing plate PP and the application layer carried on the blanket BL is patterned to form the pattern layer. Following this, the suction plate 37 of the upper stage unit 3 sucks and holds the substrate SB instead of the blanket BL with the substrate SB facing the pattern layer on the blanket BL while the blanket BL is sucked and held by the suction plate 51. Then, as shown in the field (b) of FIG. 17, the blanket BL is lifted toward the substrate SB to come into contact with the substrate SB, thereby forming a pattern on the lower surface of the substrate SB. Here, the blanket BL is lifted to come into contact with the printing plate PP and the substrate SB by a unique method different from the conventional technology. As described in detail below, a dimensional relationship of the suction plate 51, the blanket BL, the printing plate PP and the substrate SB is described with reference to FIGS. 20 and 21, and then the pattern forming apparatus and the pattern forming method according to the invention adopted in the above printing apparatus 100 are described with reference to FIGS. 20 to 22.

Figure 20:
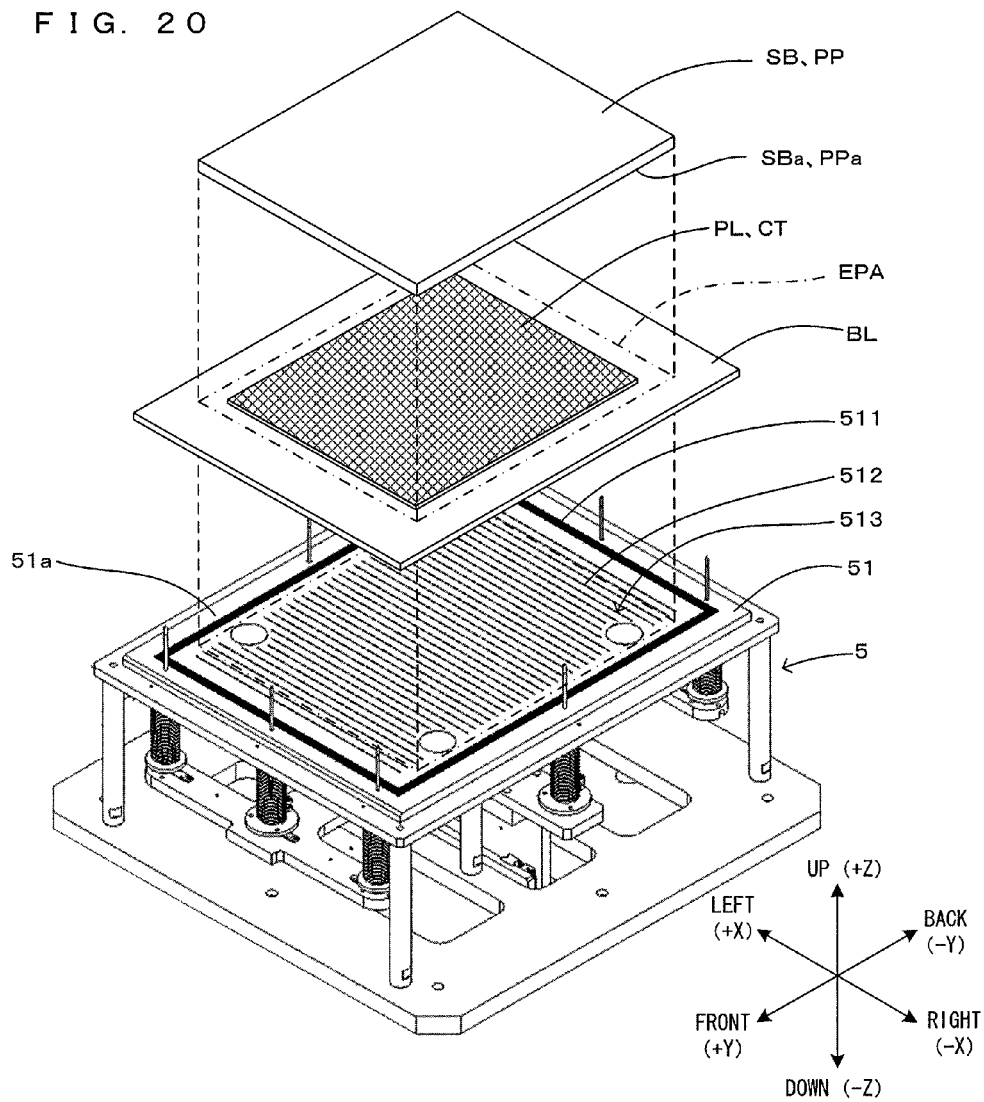
FIG. 20 is a perspective view showing a dimensional relationship of a suction plate, a blanket and a substrate.
Figure 21:
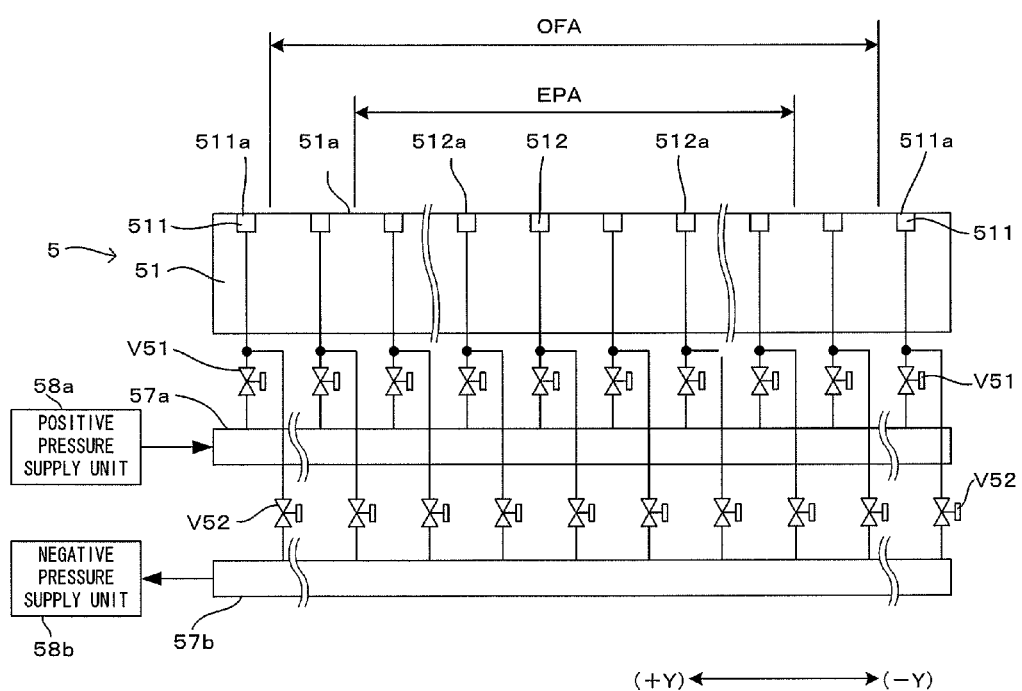
FIG. 21 is a diagram of one embodiment of the pattern forming apparatus according to the invention showing a side cross-section of the suction plate of the lower stage unit and an air pressure circuit.

FIG. 20 is a perspective view showing a dimensional relationship of a suction plate, a blanket and a substrate, and FIG. 21 is a diagram of one embodiment of the pattern forming apparatus according to the invention showing a side cross-section of the suction plate of the lower stage unit and an air pressure circuit. A lower surface PPa of a printing plate PP serves as a patterning surface having a concavo-convex pattern for patterning a coating layer CT on a blanket BL, and the coating layer CT is patterned by the concavo-convex pattern to form a pattern layer PL. Further, a lower surface SBa of a substrate SB serves a transfer target surface to which the pattern layer PL on the blanket BL is to be transferred as described above. In other words, as shown in FIG. 20, an effective pattern area EPA having the same area as the lower surface PPa of the printing plate PP and the lower surface SBa of the substrate SB is provided in a central portion of a surface of a blanket BL, and the coating layer CT and the pattern layer PL are formed within that effective pattern area EPA.

Further, the blanket BL is configured to be held by an upper surface 51a of the suction plate 51. The upper surface 51a functions as a bearing member holding surface for holding the blanket BL. On the bearing member holding surface 51a, an inner area 513 enclosed by the groove 511 is larger than the effective pattern area EPA and serves as an opening forming area OFA. Openings 512a of the suction grooves 512 are formed in the opening forming area OFA. Note that the plurality of suction grooves 512 are slit grooves extending in the X direction and arranged in a row at equal intervals in the Y direction as shown in FIG. 20. Thus, the openings 512a are formed at specified intervals in the Y direction in the opening forming area OFA as shown in FIG. 21. Further, denoted by 511a in FIG. 21 are openings of the suction grooves 511.

One end of the pipe is connected to each of the openings 511a, 512a. Further, the other end of each pipe is branched into two branch pipes, and one branch pipe is connected to a pressurization manifold 57a via the pressure valve V51 as described above. The other branch pipe is connected to a negative pressure manifold 57b via the suction valve V52. A positive pressure supply unit 58a and a negative pressure supply unit 58b for respectively supplying a positive pressure and a negative pressure adjusted by regulators are connected to these manifolds 57a, 57b. Thus, by the valve control unit 64 of the control unit 6 individually controlling the opening/closing states of these valves V51, V52, the positive pressure and the negative pressure are selectively supplied and stopped being supplied for each of the openings 511*a*, 512*a*. That is, each of the openings 511*a*, 512*a* functions as a pressure supply port.

Figure 22:
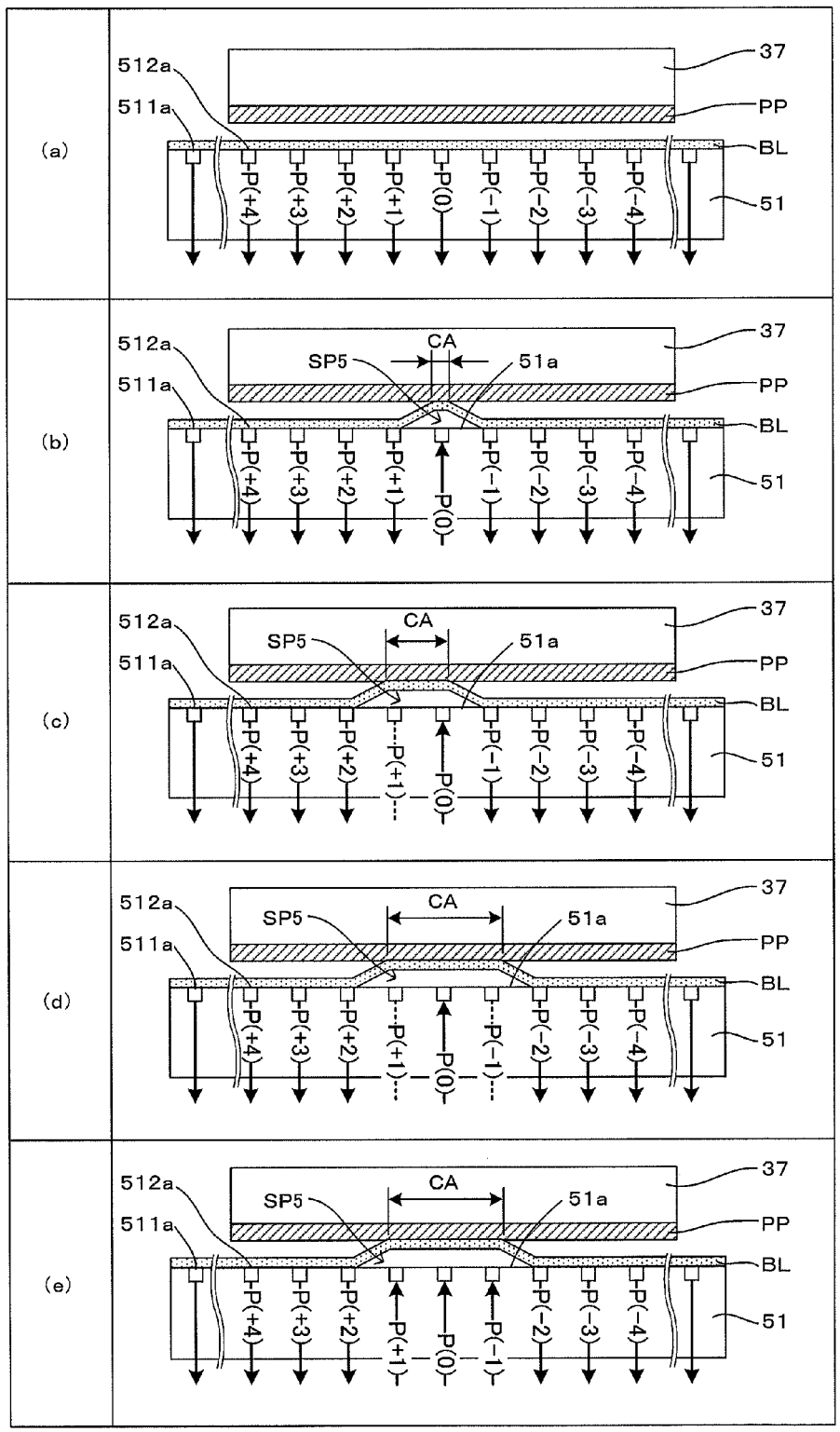
FIG. 22 is a chart diagrammatically showing a pattern forming operation in the printing apparatus according to the invention.

In this specification, to distinguish the respective openings 512*a* according to the formation positions of the suction grooves (slit grooves) 511, 512, the opening 512*a* formed at a central position of the upper surface 51*a* of the suction plate 51 is referred to as an "opening P(0)", the openings 512*a* of the slit grooves 512 arranged toward the front (+Y) side from the opening P(0) are respectively referred to as "opening P(+1), "opening P(+2), . . . and the openings 512*a* of the slit grooves 512 arranged toward the rear (−Y) side from the opening P(0) are respectively referred to as "opening P(−1), "opening P(−2), . . . as shown in FIG. 22. Using these, the pattern forming method in this embodiment is described in detail with reference to FIG. 22.

FIG. 22 is a chart diagrammatically showing a pattern forming operation in the printing apparatus according to the invention. Arrow lines in FIG. 22 respectively indicate states of pressures supplied to the respective openings 512*a*, i.e.

Upward arrow solid line . . . positive pressure supply
Downward arrow solid line . . . negative pressure supply
Dotted line without arrow . . . supply stop.

Note that the operation of forming the pattern layer on the blanket BL by bringing the blanket BL into contact with the printing plate PP sucked and held by the suction plate 37 (Substep 5-6) is described here. Since the operation of forming the pattern on the substrate SB (Substep 9-9) is also basically the same, it is denoted by the same or equivalent reference signs and not described. Note that this point applies also for an embodiment described later.

Immediately before the start of the pattern forming method (patterning S5), the blanket BL is sucked by the entire upper surface 51*a* of the suction plate 51. That is, the valve control unit 64 of the control unit 6 closes all the valves V51 while opening all the valves V52, thereby supplying the negative pressure to the respective openings 511*a*, 512*a* (field (a) of FIG. 22).

Then, the valve control unit 64 closes the valve V52 connected to the opening P(0) at the central position of the upper surface and opens the valve V51 connected thereto to supply the positive pressure from the opening P(0), thereby starting the pattern forming operation (field (b) of FIG. 22). By the supply of the positive pressure, pressurized air enters between the central portion of the blanket BL and the upper surface 51*a* to form a pressurized space SP5, whereby the central portion of the blanket BL is lifted and comes into contact with the lower surface of the printing plate PP. On the other hand, the negative pressure is supplied to any one of the openings P(+1), P(+2), . . . , P(−1), P(−2), . . . located toward the (+Y) end edge side and the (−Y) end edge side than the opening P(0) to hold the blanket BL by suction. This state corresponds to a "state where a central portion of a blanket is lifted from a flat surface and brought into contact with an object". At this moment, the opening P(0) corresponds to a "first opening" of the invention and the openings P(+1), P(+2), P(−1), P(−2), . . . correspond to "second openings" of the invention.

Subsequently, the valve control unit 64 of the control unit 6 switches the valve V52 connected to the opening P(+1) adjacent to the opening P(0) in the open state out of the second openings at this moment from the open state to the closed state while keeping the valve V51 connected thereto closed, thereby stopping the supply of the negative pressure to the opening P(+1) (field (c) of FIG. 22). Accordingly, near the opening P(+1), a force for holding the blanket BL becomes gradually weaker against a pressure force in the pressurized space SP5. Associated with that, a gas component in the pressurized space SP5 flows into a space between a portion of the blanket BL vertically above the opening P(+1) and the upper surface 51*a* to lift the blanket portion from the upper surface 51*a* and bring it into contact with the lower surface of the printing plate PP. In this way, an area of the blanket BL brought into contact with the printing plate PP, i.e. a contact area CA is slowly and stably widened from the central portion toward the (+Y) end edge side while a sudden change of the pressure in the pressurized space SP5 is suppressed. Thus, it can be reliably prevented that residual air bubbles enter between the printing plate PP and the blanket BL during the widening.

As just described, in the widening step shown in the field (c) of FIG. 22, the opening P(+1) corresponds to a "third opening" of the invention. Further, a state where the widening of the contact area CA is completed also corresponds to the "state where the central portion of the blanket is lifted from the flat surface and brought into contact with the object". At this moment, the opening P(0) corresponds to the "first opening" of the invention and the openings P(+2), P(−1), P(−2), . . . correspond to the "second openings" of the invention.

When the widening of the contact area CA toward the (+Y) end edge side is completed, a widening step of the contact area CA toward the (−Y) end edge side is performed. That is, the valve control unit 64 of the control unit 6 switches the valve V52 connected to the opening P(−1) adjacent to the opening P(0) in the positive pressure supplying state out of the second openings at this moment from the open state to the closed state while keeping the valve V51 connected thereto closed, thereby stopping the supply of the negative pressure to the opening P(−1) (field (d) of FIG. 22). Then, as in the widening step of the contact area CA toward the (+Y) end edge side (field (c) of FIG. 22), near the openings P(−1), the force for holding the blanket BL becomes gradually weaker against the pressure force in the pressurized space SP5 and the contact area CA is slowly and stably widened from the central portion toward the (−Y) end edge side while a sudden change of the pressure in the pressurized space SP5 is suppressed. Thus, it can be reliably prevented that residual air bubbles enter between the printing plate PP and the blanket BL also during this widening.

As just described, in the widening step shown in the field (d) of FIG. 22, the opening P(−1) corresponds to the "third opening" of the invention. Further, a state where the widening of the contact area CA is completed also to the "state where the central portion of the blanket is lifted from the flat surface and brought into contact with the object" of the invention. At this moment, the opening P(0) corresponds to the "first opening" of the invention and the openings P(+2), P(−2), . . . correspond to the "second openings" of the invention.

By performing the widening step, the pressurized space SP5 may expand and the pressure force (or pressing force) for pressing the blanket BL against the printing plate PP may be reduced. Accordingly, after the widening step is performed a specified number of times (twice in this embodiment), the valve control unit 64 of the control unit 6 switches the valves V51 connected to the openings P(+1), P(−1) to which the supply of the negative pressure has been stopped from the closed state to the open state and starts the supply of the positive pressure to the respective openings P(+1), P(−1) (field (e) of FIG. 22). By the positive pressure supply adding step, the positive pressure is supplied anew by as much as the pressurized space SP5 has expanded and the pressure force (or pressing force) for pressing the blanket BL against the printing plate PP can be made stable. Note that, at this moment, the openings P(0), P(+1) and P(−1) correspond to the "first opening" of the invention.

In this embodiment, by repeatedly performing the above widening step and positive pressure supply adding step, the blanket BL can be satisfactorily brought into contact with the printing plate PP without causing the residue of air bubbles and the pattern layer can be formed on the blanket BL by the printing plate PP.

Further, while the pattern is being formed, the peripheral edge portion of the blanket BL can be held in close contact with the suction plate 51 by constantly supplying the negative pressure to the openings 511*a* and pattern formation can be stably performed.

As just described, in this embodiment, the suction plates 37, 51 respectively correspond to a "first holder" and a "second holder". Further, the positive pressure supply unit 58*a*, the pipes and the pressure valves V51 form a "positive pressure supplier" of the invention, and the negative pressure supply unit 58*b*, the pipes and the suction valves V52 form a "negative pressure supplier" of the invention. The control unit 6 and the valve control unit 64 correspond to a "controller" of the invention. Further, the "X direction" corresponds to a "first direction" of the invention and the "Y direction" corresponds to a "second direction" of the invention.

Figure 23:
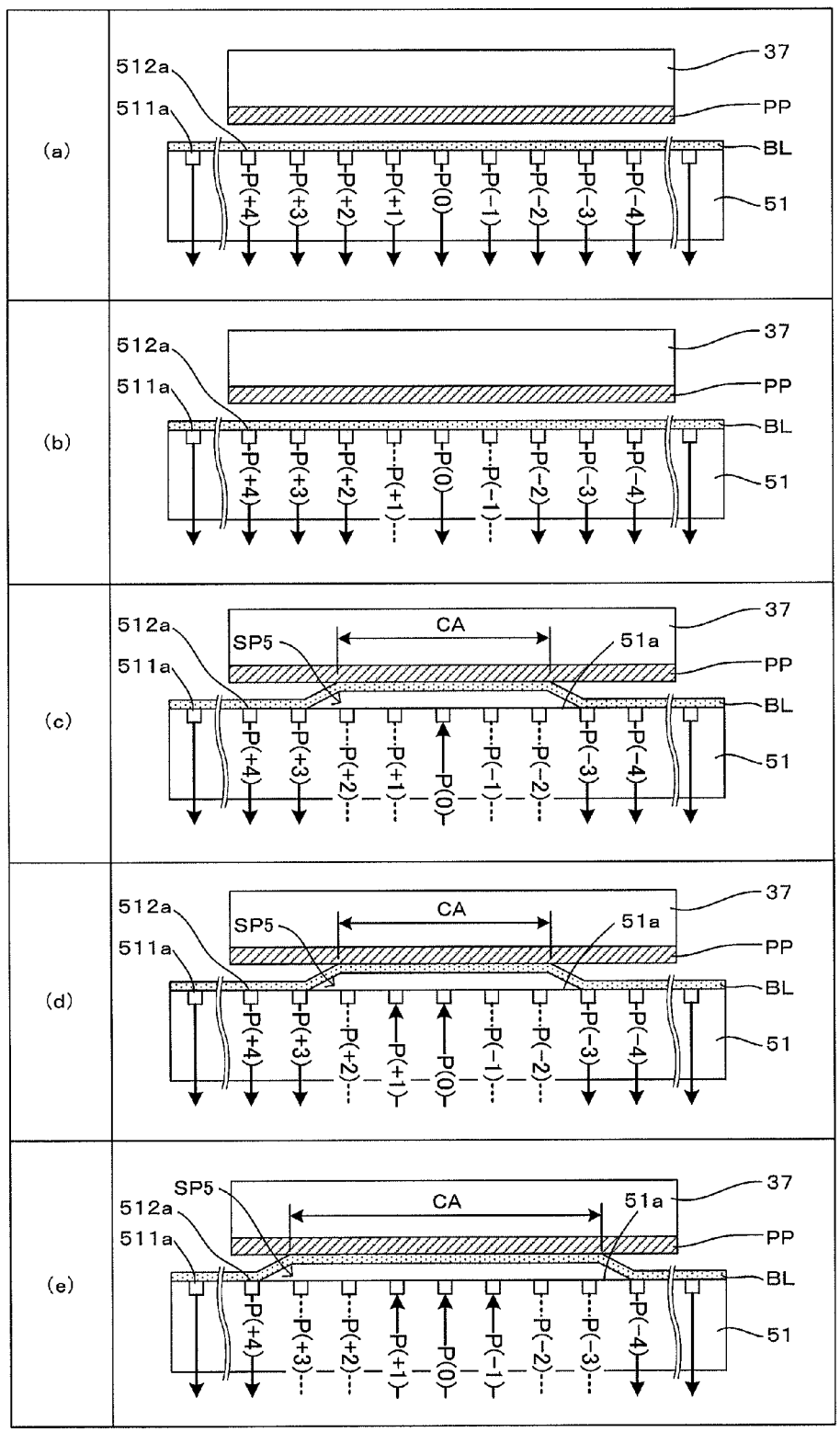
FIG. 23 is a diagram showing another embodiment of the pattern forming operation according to the invention.

FIG. 23 is a diagram showing another embodiment of the pattern forming operation according to the invention. This embodiment differs from the pattern forming method shown in FIG. 22 in a valve switching mode in the step of first lifting the blanket BL and a widening mode of the contact area CA in the widening step and other points are basically the same. The following description will be made with reference to FIG. 23.

Also in this embodiment, immediately before the start of the pattern forming method (patterning S5), the blanket BL is sucked by the entire upper surface 51*a* of the suction plate 51. That is, the valve control unit 64 of the control unit 6 closes all the valves V51 while opening all the valves V52, thereby supplying the negative pressure to the respective openings 511*a*, 512*a* (field (a) of FIG. 23).

Then, the valve control unit 64 simultaneously switches the valves V52 connected to the openings P(+1), P(−1) located at the opposite sides of the opening P(0) at the central position of the upper surface in the Y direction from the open state to the closed state while keeping the valves V51 connected thereto closed, thereby stopping the supply of the negative pressure to the openings P(+1), P(−1) (field (b) of FIG. 23). Following this, the valve control unit 64 simultaneously controls the opening and closing of the valves V51, V52 connected to the openings P(0), P(+2) and P(−2) as follows. That is, the valve V52 connected to the opening P(0) is closed and the valve V51 connected thereto is opened to supply the positive pressure from the opening P(0). Simultaneously, the valves V52 connected to the openings P(+2), P(−2) are simultaneously switched from the open state to the closed state while the valves V51 connected thereto are kept closed, whereby the supply of the negative pressure to the openings P(+2), P(−2) is stopped. As a result, pressurized air enters between the blanket central portion located vertically above the openings P(0), P(+1), P(−1), P(+2) and P(−2) and the upper surface 51*a* by the positive pressure supplied from the opening P(0), thereby forming a pressurized space SP5. Accordingly, the central portion of the blanket BL extending in a wider range than in the embodiment shown in FIG. 22 is lifted to come into contact with the lower surface of the printing plate PP (field (c) of FIG. 23). On the other hand, the negative pressure is supplied to any one of the openings P(+3), P(+4), . . . located at a (+Y) end edge side of the opening P(+2) and the openings P(−3), P(−4), . . . located at a (−Y) end edge side of the opening P(−2), whereby the blanket BL is sucked and held. This state corresponds to the "state where the central portion of the blanket is lifted from the flat surface and brought into contact with the object". At this moment, the opening P(0) corresponds to the "first opening" of the invention and the openings P(+3), P(+4), . . . , P(−3), P(−4), . . . correspond to the "second openings" of the invention.

Since the pressurized space SP5 is relatively wider, the valve control unit 64 of the control unit 6 switches the valve V51 connected to the opening P(+1) that is not supplying the negative pressure from the closed state to the open state to start the supply of the positive pressure to the opening P(+1) in this embodiment (field (d) of FIG. 23). By the positive pressure supply adding step, the positive pressure is supplied anew to the pressurized space SP5 and the pressure force (or pressing force) for pressing the blanket BL against the printing plate PP can be made stable. Note that, at this moment, the openings P(+3), P(+4), . . . , P(−3), P(−4), . . . remain to correspond to the "second openings" of the invention, but the opening P(+1) newly corresponds to the "first opening" of the invention.

Next, the valve control unit 64 of the control unit 6 switches the valves V52 connected to the openings P(+3), P(−3) adjacent to the openings P(0), P(+1) in the positive pressure supplying state out of the second openings at this moment from the open state to the closed state while keeping the valves V51 connected thereto closed, thereby stopping the supply of the negative pressure to the openings P(+3), P(−3) (field (e) of FIG. 23). Then, as in the above widening step, near the openings P(+3), P(−3), the force for holding the blanket BL becomes gradually weaker against the pressure force in the pressurized space SP5 and the contact area CA is slowly and stably widened from the central portion toward the (+Y) end edge side and the (−Y) end edge side while a sudden change of the pressure in the pressurized space SP5 is suppressed. Thus, it can be reliably prevented that residual air bubbles enter between the printing plate PP and the blanket BL also during the widening. Simultaneously, the valve control unit 64 of the control unit 6 switches the valve V51 connected to the opening P(−1), which is not supplying the negative pressure, from the closed state to the open state, thereby starting the supply of the positive pressure to the opening P(−1). By the new supply of the positive pressure, the pressure force (or pressing force) for pressing the blanket BL against the printing plate PP can be made stable.

As just described, in the widening step shown in the field (e) of FIG. 23, the openings P(+3), P(−3) correspond to the "third opening" of the invention. A state where the widening of the contact area CA is completed also corresponds to the "state where the central portion of the blanket is lifted from the flat surface and brought into contact with the object" of the invention. At this moment, the openings P(0), P(+1) and P(−1) correspond to the "first opening" of the invention and the openings P(+4), . . . , P(−4), . . . correspond to the "second openings" of the invention.

Also in this embodiment, by performing the widening step and the positive pressure supply adding step, the blanket BL can be satisfactorily brought into contact with the printing plate PP without causing the residue of air bubbles and the pattern layer can be formed on the blanket BL by the printing plate PP as in the embodiment shown in FIG. 22. While the pattern is being formed, the peripheral edge portion of the blanket BL can be held in close contact with the suction plate 51 by constantly supplying the negative pressure to the openings 511*a* and pattern formation can be stably performed.

E. Miscellaneous

Note that the invention is not limited to the above embodiments and various changes can be made to those described above without departing from the gist of the invention. For example, although the plate-like objects such as the printing plate PP and the substrate SB are sucked and held by the suction plate 37 in the above embodiment, a holding mode for these objects is not limited to this.

Although the outer shape sizes of the printing plate PP and the substrate SB are the same as shown in FIG. 20 in the above embodiments, it is not essential that the plate-like objects have a single outer shape size and the present invention is applicable also when the outer shape sizes differ from each other.

Although the openings 511a, 512a extending in the X direction are formed by providing the slit grooves 511, 512 in the upper surface 51a of the suction plate 51 in the above embodiments, the shapes, the sizes, the arrangement and the like of the respective openings are arbitrary. The invention can be also applied to an apparatus for sucking and holding a blanket by a second holder such as a suction plate provided with a plurality of openings in an upper surface 51a.

Although the pattern forming apparatus according to the invention is equipped in the printing apparatus 100 in the above embodiments, an application target of the invention is not limited to these and the invention can be applied to pattern forming apparatuses in general for forming a pattern by bringing a blanket into contact with a plate-like object.

As described above, according to the invention, the pressurized space is widened toward the end edge side by stopping the supply of the negative pressure to the third opening adjacent to the first opening in the state where a portion of the blanket facing the first opening is lifted from the flat surface and brought into contact with the object, whereby an area of the blanket brought into contact with the object is widened. Thus, pattern formation can be satisfactorily performed.

Here, an opening located in a central portion of the flat surface may be set as the first opening and a central portion of the blanket may be brought into contact with the object by supplying the positive pressure to the first opening. In this case, by stopping the supply of the negative pressure to the third opening, the area of the blanket brought into contact with the object can be widened from the central portion toward the end edge side.

Further, the supply of the positive pressure to the first opening by the positive pressure supplier may be continued while the supply of the negative pressure to the third opening is stopped. The positive pressure is supplied from the first opening when a pressurized space expands by stopping the supply of the negative pressure to the third opening. As a result, a pressure change in the pressurized space is further suppressed. Particularly, if the supply of the negative pressure to a plurality of third openings is simultaneously stopped, the pressurized space expands to a large degree. Thus, it is effective to continue the supply of the positive pressure from the first opening in parallel with that.

Further, the second holder may further include a groove portion formed in the flat surface to surround the plurality of openings and the negative pressure supplier may be configured to supply the negative pressure to the groove portion and suck and hold the blanket by the second holder. In this case, also while the contact area is being widened, the blanket is stably sucked and held by the second holder and pattern formation can be satisfactorily performed.

The shapes, the sizes and the like of the respective openings formed in the flat surface are arbitrary. For example, the respective openings may be slit grooves extending in the first direction parallel to the flat surface. Further, a plurality of these slit grooves may be arranged in the second direction parallel to the flat surface and perpendicular to the first direction. In this case, the contact area is formed to extend in the first direction and, in that state, the contact area expands toward both sides in the second direction, wherefore pattern formation can be stably performed. Particularly, a widening rate of the contact area can be easily made stable and stability in pattern formation can be further improved by making an interval between slit grooves constant.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A pattern forming apparatus, comprising:
a first holder that holds a plate-like object;
a second holder, including a flat surface facing the object held by the first holder and a plurality of openings formed in the flat surface, that is adapted to hold a blanket with the flat surface by suction;
a positive pressure supplier that supplies a positive pressure to each opening;
a negative pressure supplier that supplies a negative pressure to each opening; and
a controller that controls the supply of the positive pressure by the positive pressure supplier and the supply of the negative pressure by the negative pressure supplier for each of the openings,
wherein the plurality of openings include a first opening and a plurality of second openings, and the plurality of second openings include a third opening adjacent to the first opening;
the controller supplies the positive pressure to the first opening to lift a portion of the blanket from the flat surface so that the lifted portion is brought into contact with the object while supplying the negative pressure to the plurality of second openings to hold the blanket by suction; and
the controller stops supplying the negative pressure to the third opening so as to widen an area of the blanket brought into contact with the object.

2. The pattern forming apparatus according to claim 1, wherein
the first opening is located in a central portion of the flat surface;
the third opening is located toward an end edge side of the flat surface with respect to the first opening; and
the controller supplies the positive pressure to the first opening so as to bring a central portion of the blanket into contact with the object, and stops supplying the negative pressure to the third opening so as to widen the area of the blanket brought into contact with the object toward the end edge side.

3. The pattern forming apparatus according to claim 1, wherein the controller keeps supplying the positive pressure to the first opening while stopping the supply of the negative pressure to the third opening.

4. The pattern forming apparatus according to claim 1, wherein
the second holder includes a groove formed in the flat surface so as to enclose the plurality of openings, and the controller supplies the negative pressure to the groove to hold the blanket by suction.

5. The pattern forming apparatus according to claim 1, wherein each opening is a slit groove extending in a first direction parallel to the flat surface.

6. The pattern forming apparatus according to claim 5, wherein the plurality of slit grooves are arranged in a second direction parallel to the flat surface and perpendicular to the first direction.

7. The pattern forming apparatus according to claim 6, wherein an interval between the slit grooves is constant.

8. A pattern forming method, comprising:
  a first step of holding a plate-like object by a first holder;
  a second step of holding a blanket with a flat surface of a second holder facing the object held by the first holder, the flat surface having a plurality of openings that include a first opening and a plurality of second openings;
  a third step of supplying a positive pressure to the first opening to lift a portion of the blanket from the flat surface and bring the lifted portion into contact with the object while supplying the negative pressure to the plurality of second openings to hold the blanket by suction; and
  a fourth step of stopping the supply of the negative pressure to a third opening so as to widen an area of the blanket brought into contact with the object, the third opening being included in the plurality of second openings and adjacent to the first opening.

9. The pattern forming method according to claim 8, wherein
  the third step is a step of setting the opening located in a central portion of the flat surface as the first opening and bringing a central portion of the blanket into contact with the object by supplying the positive pressure to the first opening; and
  the fourth step is a step of widening the area of the blanket brought into contact with the object from the central portion toward an end edge side of the flat surface by stopping the supply of the negative pressure to the third opening.

* * * * *